United States Patent
Alakuijala et al.

(10) Patent No.: US 11,669,553 B2
(45) Date of Patent: Jun. 6, 2023

(54) CONTEXT-DEPENDENT SHARED DICTIONARIES

(71) Applicant: GOOGLE LLC, Mountain View, CA (US)

(72) Inventors: Jyrki Antero Alakuijala, Wollerau (CH); Lode Vandevenne, Ruschlikon (CH)

(73) Assignee: GOOGLE LLC, Mountain View, CA (US)

( * ) Notice: Subject to any disclaimer, the term of this patent is extended or adjusted under 35 U.S.C. 154(b) by 363 days.

(21) Appl. No.: 16/706,110

(22) Filed: Dec. 6, 2019

(65) Prior Publication Data

US 2020/0110767 A1 Apr. 9, 2020

Related U.S. Application Data

(63) Continuation of application No. PCT/US2017/036372, filed on Jun. 7, 2017.

(51) Int. Cl.

| | |
|---|---|
| G06F 16/31 | (2019.01) |
| G06F 16/182 | (2019.01) |
| G06F 40/205 | (2020.01) |
| G06F 40/274 | (2020.01) |
| G06F 9/46 | (2006.01) |

(Continued)

(52) U.S. Cl.
CPC ............ G06F 16/313 (2019.01); G06F 9/466 (2013.01); G06F 16/182 (2019.01); G06F 40/205 (2020.01); G06F 40/274 (2020.01); H03M 13/15 (2013.01); H03M 13/37 (2013.01)

(58) Field of Classification Search
CPC ..... G06F 16/313; G06F 16/182; G06F 40/205
See application file for complete search history.

(56) References Cited

U.S. PATENT DOCUMENTS

| | | | |
|---|---|---|---|
| 9,081,834 B2* | 7/2015 | Bhave | ............. G06F 16/25 |
| 2012/0011419 A1* | 1/2012 | Araki | ........... H03M 13/1515 |
| | | | 714/784 |

(Continued)

FOREIGN PATENT DOCUMENTS

| | | |
|---|---|---|
| EP | 0685822 A2 | 12/1995 |
| WO | 2016058138 A1 | 4/2016 |

OTHER PUBLICATIONS

Hoang et al, "Multiple-Dictionary Compression Using Partial Matching", IEEE, 1069-0314, 10 pages (Year: 1995).*

(Continued)

*Primary Examiner* — Loc Tran
(74) *Attorney, Agent, or Firm* — Brake Hughes Bellermann LLP

(57) ABSTRACT

An context-based encoding mechanism uses a predetermined number of bytes in a previous segment of a file to determine a context for the current segment. The current segment is encoded using a dictionary that corresponds to the determined context. An example method includes determining, for a first segment in a data file, a first context state based on a first context segment within the data file that precedes the first segment, identifying a first indexed dictionary from a plurality of indexed dictionaries based on the first context state, and encoding the first segment using the identified first indexed dictionary.

19 Claims, 12 Drawing Sheets

(51) Int. Cl.
H03M 13/15 (2006.01)
H03M 13/37 (2006.01)

(56) References Cited

U.S. PATENT DOCUMENTS

2013/0120168 A1* 5/2013 Kumar ............... H03M 7/3059
341/90
2013/0346483 A1 12/2013 Alstad et al.

OTHER PUBLICATIONS

Hoang et al, "Multiple-Dictionary Compression Using Partial Matching", 1995, IEEE, 10 pages (Year: 1995).*
International Search Report and Written Opinion for International Application PCT/US2017/036372, dated Feb. 8, 2018, 12 pages.
Written Opinion for International Application No. PCT/US2017/036372, dated Apr. 17, 2019, 6 pages.
Carus, et al., "Fast Text Compression Using Multiple Static Dictionaries", Information Technology Journal, vol. 9(5), XP05544388, Dec. 31, 2010, pp. 1013-1021.
Hoang, et al., "Multiple-Dictionary Compression Using Partial Matching", Data Compression Conference, Proceedings, IEEE Computer Society, XP002554840, Mar. 30, 1995, pp. 272-281.

* cited by examiner

CONTEXT-DEPENDENT SHARED DICTIONARIES

REFERENCE TO RELATED APPLICATION

This application is a continuation of PCT Application No. PCT/US2017/036372, filed Jun. 7, 2017, titled "Context-Dependent Shared Dictionaries," the disclosure of which is incorporated herein in its entirety.

BACKGROUND

Transmitting large amounts of data can consume significant communication and/or networking resources. The format of representation of the data can impact the resources required to transmit the data.

SUMMARY

This description relates to compressing and decompressing data.

In a general aspect, a non-transitory computer-readable storage medium includes instructions stored thereon. When the instructions are executed by at least one processor, they are configured to cause a computing system to at least determine, for a first segment in a data file, a first context state based on a first context segment within the data file that precedes the first segment. The instructions, when executed, further cause the computing system to identify a first indexed dictionary from a plurality of indexed dictionaries based on the first context state and to encode the first segment using the identified first indexed dictionary.

In another general aspect, a method includes receiving an encoded data file that includes a plurality of codewords. The method also includes decoding a first codeword from the plurality of codewords and, after decoding the first codeword, determining a first context for a second codeword from the plurality of codewords based on at least portion of the decoded first codeword. The method also includes identifying, based on the first context state, a first indexed dictionary from a plurality of indexed dictionaries and decoding the second codeword using the identified first indexed dictionary.

In another general aspect, a computer system includes at least one processor and memory storing instructions. The instructions, when executed by the at least one processor, cause the system to determine, for a first segment in a data file, a first context state based on a first context segment within the data file that precedes the first segment, identify, based on the determined first context state, a first indexed dictionary from a plurality of indexed dictionaries, identify, based on the determined first context state, a first transformation set from a plurality of transformation sets, and encode the first segment using the identified first indexed dictionary and the identified first transformation set. A second context state is determined for a second segment in the data file based on a second context segment within the data file that precedes the second segment, and a second indexed dictionary is identified, based on the determined second context state, from the plurality of indexed dictionaries, where the second indexed dictionary is different than the first indexed dictionary. A second transformation set is identified, based on the determined second context state, from a plurality of transformation sets, where the second transformation set is different than the first transformation set, and the second segment is encoded using the identified second indexed dictionary and the identified second transformation set.

The details of one or more implementations are set forth in the accompanying drawings and the description below. Other features will be apparent from the description and drawings, and from the claims.

BRIEF DESCRIPTION OF THE DRAWINGS

FIG. 8 is a diagram showing a packet according to an example implementation.

DETAILED DESCRIPTION

Figure 1:
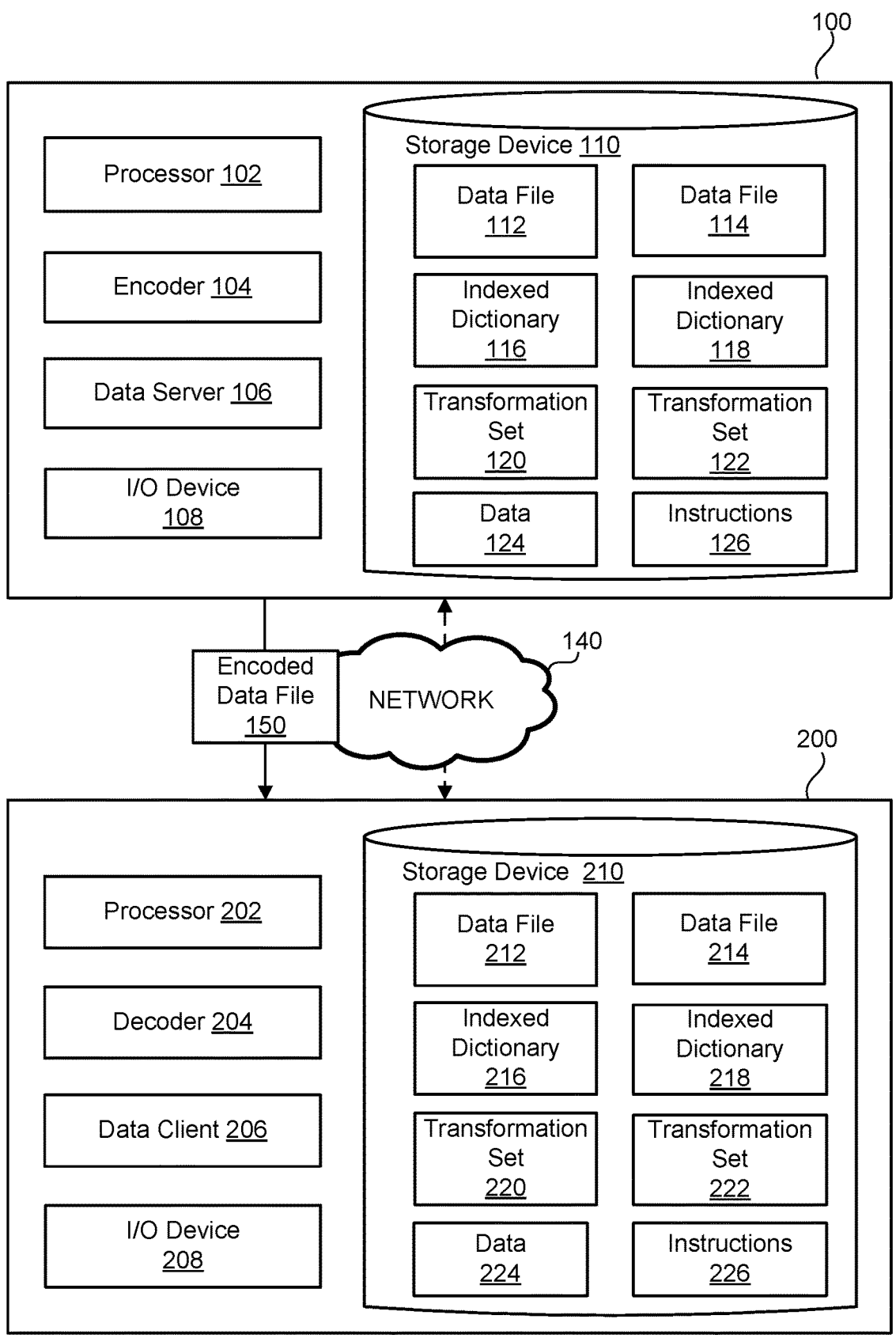
FIG. 1 is a schematic diagram of an example computing system and an example computing system communicating via a network.

FIG. 1 is a schematic diagram of an example computing system 100 and an example computing system 200 configured for communicating via a network 140. The computing system 100 can transmit an encoded data file 150 via the network 140 to the computing system 200.

The computing system 100 includes a processor 102, an encoder 104, a data server 106, an input/output (I/O) device 108, and a storage device 110. The processor 102 is a device capable of executing instructions and performing operations to perform the methods and functions described herein.

The encoder 104 encodes data. In some implementations, the encoding of the data compresses the data. The compressed data may be transmitted to another computing device (e.g., via the network 140) more quickly and/or using fewer network resources than uncompressed data. In some implementations, the compressed data is stored so that less storage space is required for storing the data than would be needed if the data were not compressed. In some implementations, the encoder 104 includes circuitry and/or instructions that are stored on the storage device 110 and executed by the processor 102.

The data server 106 can serve data to clients over the network 140. For example, the data server 106 can be a webserver that serves content such as web pages, images, etc., in response to requests received from a client. The data server 106 can also be another type of server such as, a web services server, a file transfer protocol (FTP) server, a database server, or an application server. The content served by the data server 106 can include, for example, one or more data files or other data stored by the storage device 110. The data server 106 can also serve dynamically generated data. In some implementations, the data server 106 encodes the data using the encoder 104 before serving the encoded data to a client. Additionally, the data server 106 can serve one or more indexed dictionaries that are used for encoding/decoding data.

The storage device 110 may include one or more non-transitory computer-readable storage medium. The storage device 110 includes a plurality of data files, including a data file 112 and a data file 114, and a plurality of indexed dictionaries, including an indexed dictionary 116 and an indexed dictionary 118, and a plurality of transform sets, including a transformation set 120 and a transformation set 122. Although this example shows two data files, two indexed dictionaries, and two transformation sets, there could be any number of data files, any number of indexed dictionaries, and any number of transformation sets. Additionally, the number of data files can be different from the number of indexed dictionaries, and the number of transformation sets can be different from the number of data files and the number of indexed dictionaries.

The storage device 110 may also include data 124. The data 124 may include data stored by the computing system 100 in addition to and/or including data previously described. The storage device 110 may also include instructions 126. The instructions 126 may include instructions executed by the processor 102 to perform any of the methods and/or functions described herein.

The data file 112 and the data file 114 may include sequences that include a plurality of symbols. The plurality of symbols may be represented according to an encoding format, such as a fixed length encoding format including ASCII or an encoding format for Unicode characters such as UTF-8, UTF-16, and UTF-32. In some implementations, at least a portion of the sequence of symbols represents words from a lexicon. For example, the data file 114 can represent a web page that includes content, such as words from a lexicon, and markup tags that define the presentation of the content.

The indexed dictionary 116 and the indexed dictionary 118 can each include a plurality of word entries. The word entries can include sequences of symbols such as complete words from one or more lexicons and portions of words from one or more lexicons. Indexed dictionaries can include word entries for one or more focus areas. For example, some indexed dictionaries include word entries from a focus area related to a human language (e.g., Armenian, English, Finnish), such as words from a lexicon associated with one of those languages. As another example, some indexed dictionaries include word entries from a focus area related to a computer programming or markup language. Indexed dictionaries can also include word entries from a focus area related to a particular field of study, profession, hobby, or other area of interest (e.g., medicine, sports, technology, art, law). In some implementations, the word entries can also include one or more of punctuation, spaces, and/or other symbols.

Each of the indexed dictionaries may include the same and/or different word entries. For example, one of the indexed dictionaries may include words from a first lexicon and another of the indexed dictionaries may include words from a second lexicon. As another example, the indexed dictionaries may include some or all of the same word entries but the word entries may be associated with different index keys so that the word entries that are assigned shorter keys in one of the indexed dictionaries are different than the word entries assigned shorter keys in the other of the indexed dictionaries. In other words, multiple indexed dictionaries may include the same word entries in different orders. By storing the word entries in a different order, shorter index keys can be assigned to different words in each of the indexed dictionaries. As described further herein, a context can be used to identify an indexed dictionary from a plurality of indexed dictionaries for encoding/decoding purposes. In this manner, as the context of the data being encoded changes, the identified indexed dictionary can also change allowing for greater efficiency (i.e., fewer bits) in representing words that are determined to be more likely to occur in the context.

In some implementations, within an indexed dictionary, each word entry and is associated with a unique index key. The index key may be a numerical value. In some implementations, the index keys are based on a variable length code, including an entropy code or prefix-free code such as a Huffman code, and the word entries that are expected to be referenced more frequently are assigned shorter index keys than the word entries that are expected to be referenced less frequently.

In some implementations, the indexed dictionaries include sub-dictionaries based on length of the word entries. In these implementations, the index to the dictionary includes a word entry length and an index key.

Additionally, the indexed dictionaries may include an identifier and/or signature. The identifier and/or signature may be used to compare indexed dictionaries. For example, the data server 106 may send the identifier and/or signature of each indexed dictionary that is used to encode a data file or set of data files to a client. The client can then use the identifier and/or signature to determine whether the indexed dictionaries are currently available on the client, and, if necessary, to retrieve the indexed dictionaries (e.g., from the computing system 100 or elsewhere). The signature can include a checksum such as an MD5 or SHA checksum.

The transformation set 120 and the transformation set 122 can each include a plurality of transformations. The transformations are operations that convert one sequence to another sequence. For example, the transformations may apply various grammatical operations to a sequence. The transformations may include, for example, an addition of a space (" ") before or after the sequence, capitalization of a first character of the sequence, addition of and/or prepending a prefix before and/or to the sequence, addition of and/or appending a period or suffix after and/or to the sequence, addition of a space and a common word (e.g., "the", "the") before or after the sequence, or a change of font (e.g., italicization) of the word. As an example, a transformation may insert "the" at the beginning of word entry and append "of the" at the end of the word entry. Thus, if a retrieved word entry is "supercalifragilistic", a transformation could convert that word entry to "the supercalifragilistic of the." As another example, a transformation could inset the prefix "super" to the beginning of a word entry. Thus, if a word entry of "califragilistic" were received, this transformation could convert that word entry to "supercalifragilistic".

Each of the transformation sets may include the same and/or different transformations. For example, one of the transformation sets may include transformations that are expected to occur particularly frequently within a particular language such as prepending or appending articles (e.g., "the" in a transformation set for English, or "ett" "en" in a transformation set for Swedish). The transformation sets can also include transformations that occur particularly frequently in certain types of data, such as adding various characters (e.g., appending a ";", adding opening/closing tags "<>", etc.) in code for various programming languages or markup languages. As another example, the transformation sets may include some or all of the same transformations but the transformations may be associated with different index keys so that the transformations that are assigned shorter keys in one of the transformation sets are different than the transformations that are assigned shorter keys in the other of the transformation sets.

In some implementations, each of the transformations within a transformation set are associated with a unique index key that can be used to reference the transformation. The index key may be a numerical value. In some implementations, the index keys are based on a variable length code, including an entropy code or prefix-free code such as a Huffman code, and the transformations that are expected to be referenced more frequently are assigned shorter index keys than the transformations that are expected to be referenced less frequently.

The indexed dictionaries and transformation sets may be generated in a variety of ways. For example, in some implementations, the computing system 100 includes a dictionary generating component that processes a corpus of data related to a particular focus area to identify frequently occurring sequences of symbols (e.g., as potential word entries in an indexed dictionary) or common prefixes or suffixes (e.g., as potential transforms in a transformation set). In some embodiments, the corpus of data comprises a web corpus that includes web pages. The corpus of data may be labeled (e.g., by an operator) as being associated with a particular focus. The corpus can also be associated with a particular focus area based on the source of data (e.g., the domain or country code top level domain from which the data was received). Additionally, a machine learning component can be used to generate a corpus related to a focus area. For example, the machine learning algorithm may identify a group of related data (e.g., pages from websites that all relate to the same topic) by clustering unlabeled data based on similarity. The clusters can then be used to generate indexed dictionaries and/or transformation sets.

Because at least some of the indexed dictionaries include word entries that correspond to words from a human language, grammatical rules can be incorporated into transformations that are relevant to multiple of the word entries. Storing a relatively small number of transforms (e.g., as compared to the number of word entries) may significantly increase the number of sequences that can be generated using combinations of word entries and transforms. Because a transformation set can be generated for a particular indexed dictionary, the transformation set can include transformations that are more likely to occur with that indexed dictionary (e.g., based on analysis of a corpus of training data). Because there are usually a limited number of transformations in a transformation sets, the amount of data required to represent a transformation set may be quite small compared to an indexed dictionary. Nonetheless, the transformation sets can significantly increase the utility of the indexed dictionary. In an example, a transformation set may be approximately 0.2% of the size of an indexed dictionary, but using the transformation set according to the techniques described herein may increase the utility of the indexed dictionary by as much as 20%.

In some implementations, the encoder 104 encodes one or more data files, such as the data file 112, using multiple of the indexed dictionaries and/or multiple of the transformation sets based on context. For example, the encoder 104 may divide a data file into multiple segments and then generate a codeword for each of the segments. The codewords may have varying lengths. In some implementations, the codewords specify whether the corresponding segment is encoded with reference to a previous segment of the data file, an entry in a context-dependent indexed dictionary, or as a literal value. In some implementations, the encoded literal value includes is the same as the original literal value (i.e., the data in the literal value is unchanged in the encoded representation).

The encoder 104 may determine a context state for at least some of the segments. A context state can include, for example, a classification of a segment of a sequence of symbols, where the classification is determined based on a context segment that is a portion of the sequence that precedes a particular segment and that is used to determine the context state for the segment. In some implementations, the context state for a segment is selected from a plurality of context states based on applying a hash function to a context segment. In some implementations, the context state is associated with an indexed dictionary. In some implementations, the context state is associated with an indexed dictionary and a transformation set.

Based on the determined context state, the encoder 104 can encode the segment using a particular one of the indexed dictionaries and/or a particular one of the transformation sets. In some implementations, the segments represent words in the data file. The encoder 104 then encodes each of the segments. In some implementations, the encoder 104 encodes a segment with reference to a previously encoded segment of the data file, with reference to one or more indexed dictionaries, and/or with reference to one or more transformation sets. For example, the encoder 104 may convert a sequence of segments representing words in a data file into a sequence of codewords. Each of the codewords could then be decoded by a corresponding decoder to determine whether to retrieve data from a preceding portion of the data file or from a word entry in a particular indexed dictionary. Additionally, in some implementations, the codeword can be decoded to determine whether a particular transformation should be applied to the retrieved word entry.

The encoder 104 may determine a context state for a target segment that is being encoded based on a portion of the data file that precedes the target segment and/or a portion of the target segment. In some implementations, the encoder 104 determines the context state by performing a function on two bytes of the data file. For example, the context state may be determined based on the two bytes that immediately precede the segment. In some embodiments, the context state may be determined using more or fewer than two preceding bytes. The function that is performed may be a mathematical function that is applied to the bytes to map to a context state and from the context state to an indexed dictionary for encoding the target segment. For example, the function that is performed may be a hash function. The encoding based on the context may reduce the length of codewords required to encode most of the symbols, reducing the resources required to transmit the data and/or symbols.

The I/O device 108 may receive and/or transmit data, such as in packet form over the network 140. For example, the I/O device 108 may be used by the data server 106 to transmit data to a client, such as the encoded data file 150.

The computing system 200 includes a processor 202, a decoder 204, a data client 206, an input/output (I/O) device 208, and a storage device 210. The processor 202 is a device capable of executing instructions and performing operations to perform the methods and functions described herein.

The decoder 204 decodes encoded data, such as the encoded data file 150. In some implementations, data files are encoded to allow for faster transmission of the data therein. In some implementations, the decoder 204 includes circuitry and/or instructions that are stored on the storage device 210 and executed by the processor 202.

The storage device 210 may include one or more non-transitory computer-readable storage medium. The storage device 210 includes a plurality of data files, including a data file 212 and a data file 214, a plurality of indexed dictionaries, including an indexed dictionary 216 and an indexed dictionary 218, and a plurality of transformation sets, including a transformation set 220 and a transformation set 222. Although this example shows two data files and two indexed dictionaries, any number of data files and any number of indexed dictionaries can exist, and the number of data files can be different from the number of indexed dictionaries.

The indexed dictionary 216 and the indexed dictionary 218 may correspond to the indexed dictionary 116 and the indexed dictionary 118, respectively, and may have been received from the computing system 100 or another computing system. Similarly, the transformation set 220 and the transformation set 222 may correspond to the transformation set 120 and the transformation set 122, respectively, and may have been received from the computing system 100 or another computing system. When corresponding indexed dictionaries and transformation sets are stored on both the computing system 100 and the computing system 200, the computing system 100 can encode data files with reference to those indexed dictionaries and transformation sets and transmit the encoded data files to the computing system 200. For example, the data file 212 and the data file 214 may correspond to the data file 112 and data file 114, respectively, and may have been received as encoded data files from the computing system 100 that were encoded with reference to the indexed dictionaries and transformation sets that are common to the computing system 100 and the computing system 200.

The storage device 210 may also include data 224. The data 224 may include data stored by the computing system 200 in addition to and/or including data previously described. The storage device 210 may also include instructions 226. The instructions 226 may include instructions executed by the processor 202 to perform any of the methods and/or functions described herein.

In some implementations, the decoder 204 processes an encoded file, such as the encoded data file 150, as a sequence of codewords. As noted above, the codewords may have variable lengths. The decoder 204 may determine whether a particular codeword corresponds to a literal value, a reference to a preceding portion of the encoded file, or a reference to a word entry in a context-dependent indexed dictionary. The decoder 204 may also determine whether the codeword specifies a transform from a context-dependent transformation set.

For example, if the decoder 204 determines that a target codeword to be decoded references a word entry in an indexed dictionary, the decoder 204 may determine a context state for a target codeword that is being decoded based on the preceding portion of the data file that has already been decoded. For example, the context state may be determined by applying a mathematical function to a portion of the last two bytes of the decoded data from the immediately preceding codeword. The decoder 204 can then use the context state to identify an indexed dictionary and transformation set to use in decoding the target codeword. In some implementations, the context state may be used to select a transformation set for codewords representing literal values or for codewords representing data encoded with reference to a preceding portion of the data file.

Although FIG. 1 shows the encoder 104 and the decoder 204 being on different computer systems, in some implementations a computer system includes both an encoder and a decoder. In these implementations, the computer system may encode data for transmission using the encoder and may decode transmissions that are received using the decoder.

Figure 2:
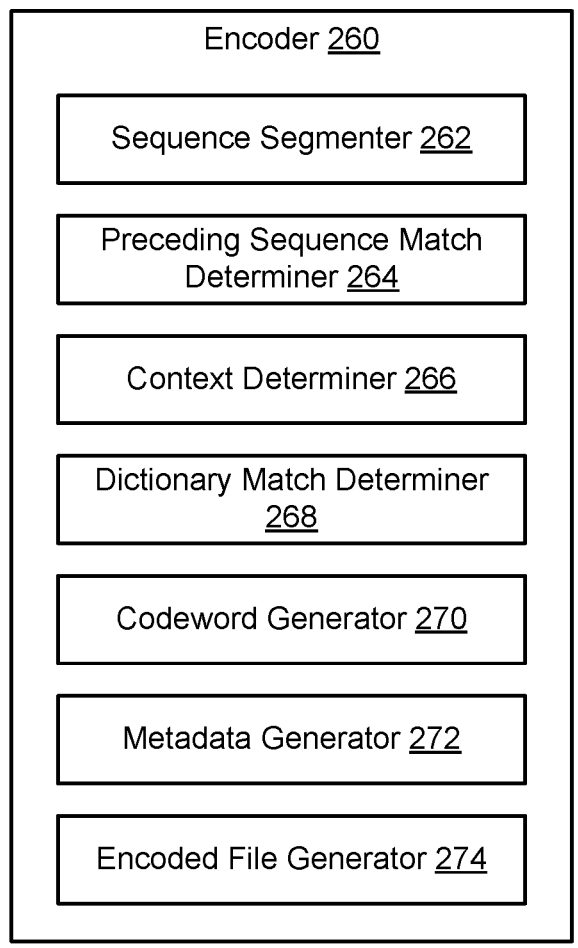
FIG. 2 is a schematic diagram of an example of the encoder of FIG. 1.

FIG. 2 is a schematic diagram of an example encoder 260. The encoder 260 is an example of the encoder 104. The encoder 260 encodes data. In some implementations, the encoder 260 includes a sequence segmenter 262, a preceding sequence match determiner 264, a context determiner 266, a dictionary match determiner 268, a codeword generator 270, metadata generator 272, and an encoded file generator 274.

The sequence segmenter 262 divides a sequence of symbols (e.g., from a data file) into sequence segments. In at least some implementations, the sequence segmenter 262 divides the sequence into sequence segments that correspond to words, such as words from a lexicon. In some implementations, the segments include spaces, punctuation, and/or other symbols the precede and/or succeed a word.

The preceding sequence match determiner 264 determines whether a target segment to be encoded matches a portion of the preceding sequence. In some implementations, the preceding sequence match determiner 264 evaluates the entire preceding sequence. In some implementations, the preceding sequence match determiner 264 evaluates a portion of the preceding sequence of a fixed size. For example, the preceding sequence match determiner 264 may store a sliding window of a predetermined size of the preceding sequence, which then can be analyzed to determine whether there is a match. In some implementations, a match is found when a portion of the preceding sequence exactly matches the target segment. If it is determined that a match is found, some implementations may determine whether additional segments also match. Then, the preceding sequence match determined 264 determines an offset to the start of the match and a length of a match is determined and can be used to generate a codeword for the target segment (or group of segments).

In some implementations, the preceding sequence match determiner 264 determines that a target sequence matches a portion of the preceding sequence when that portion matches the target sequence when a transformation is applied to the target sequence. The transformation can be, for example, from a transformation set that is identified based on a context state as determined by the context determiner 266.

The context determiner 266 determines a context for a target segment that will be encoded, such as a segment generated by the sequence segmenter 262. The context determiner 266 may determine that the target sequence is associated with one of a particular number of potential context states. For example, in some implementations, the context determiner 266 maps a target segment to a context state selected from a set of sixty-four potential context states.

The context determiner 266 may determine the context state based on at least a portion of the sequence of symbols preceding the segment. For example, the context determiner 266 may extract a context portion of a predetermined number of bytes from the sequence of symbols preceding the target segment. In some implementations, the predetermined number of bytes is two bytes. In some implementations, a different number of bytes are used in extracting the context portion. Additionally, in some implementations, the context portion is extracted based on a predetermined number of symbols (e.g., by extracting two or another number of symbols). Although alternatives are possible, the context portion can be extracted from immediately preceding the target segment.

In some implementations, the context portion can have varying lengths. For example, the length of the context portion can depend on the symbols immediately preceding a target segment. In some implementations, the context portion is extracted starting immediately preceding the target segment and continuing until a particular symbol is found. For example, the extracted context portion may extend until a space and/or another type of delimiter is identified. In some implementations, the context portion is extracted by extracting the word preceding the target segment. Additionally, the context portion can be the preceding segment.

In some implementations, the context state is determined by applying a function to the context portion. For example, the function can be a hash function that is applied to the bytes and/or symbols of the context portion to map to a context state that is associated with an indexed dictionary and/or a transformation set. Any type of hash function can be used to bucket the context portions into contexts. In some implementations, the hash functions are specific to the encoding format of the sequence string. For example, some implementations include hash functions for a UTF-8 context, signed binary number context, LSB-6 bits and MSB-6 bits. In some implementations, the function determines the length of the context portion to determine a context state.

Because the context determiner 266 determines a context from the preceding sequence, minimal additional amounts of data is needed to determine the context for a segment. Yet the context allows the segment to be encoded with reference to a potentially more relevant indexed dictionary because the indexed dictionary was selected based on the context. Furthermore, because the indexed dictionary is specific to a context, it can be smaller and the word entries stored therein can be indexed using smaller index keys. For example, the use of contexts as described herein may increase compressing density over other approaches by approximately 15%.

The dictionary match determiner 268 determines whether a target segment to be encoded matches a word entry from an indexed dictionary, such as the indexed dictionary 116 and the indexed dictionary 118. In some implementations, the dictionary match determiner 268 selects an indexed dictionary based on the context determined by the context determiner 266.

The dictionary match determiner 268 may determine whether a word entry from the indexed dictionary matches the target sequence exactly (i.e., the word entry is identical to the target sequence). Additionally, in some implementations, the dictionary match determiner 268 determines whether a word entry in the indexed dictionary can be transformed to the target sequence by applying one of the transformations from a transformation set. In some implementations, the dictionary match determiner 268 selects a transformation set based on the context determined by the context determiner 266.

The codeword generator 270 generates a codeword for a target sequence. In some implementations, the codeword generator 270 generates a codeword that includes a portion that identifies how the target segment is encoded. For example, the codewords generated by the codeword generator 270 may include a prefix that indicates whether the target sequence is encoded as a literal value, with reference to a portion of the preceding sequence, or with reference to a dictionary word. The prefix may be a single bit or a sequence of bits. In some implementations, the codeword generator 270 generates the same prefix for target segments that are encoded with reference to a match in the preceding segment or a match within an indexed dictionary. The codeword generator 270 may encode literal values using various techniques (e.g., an indicator of the length of the literal and then the actual literal sequence may be included in the codeword).

In some implementations, the codeword generator 270 includes a length and an offset value for target sequences that are encoded in terms of matches to the preceding sequence or values in an indexed dictionary. For example, the numeric value may indicate an offset (e.g., the number of bytes back from the position of the target symbol) into the preceding sequence at which the matching symbols are found. In some implementations, when a target segment is encoded with reference to a word entry in an indexed dictionary, the codeword generator 270 generates a numeric value by summing the length of the preceding sequence and the index into the index dictionary (i.e., the offset goes back past the beginning of the sequence by an amount equal to the index of the word entry). Additionally, in some implementations, when a target segment is encoded using a transformation, the codeword generator 270 generates a numeric value by summing the length of the preceding sequence, the index into the index dictionary, and the product of the index into the transformation set multiple by the number of word entries (or word entries of a particular length) in the indexed dictionary.

The metadata generator 272 generates metadata that describes the encoding performed by the encoder. In some implementations, the metadata generator 272 may generate metadata that identifies the indexed dictionaries and/or transformation sets that are used by the encoder 260 to encode a data file. For example, the metadata generator 272 may include a Universal Resource Locator (URL) or another identifier for each indexed dictionary and/or transformation set that can be used to retrieve the indexed dictionary and/or transformation set. The metadata generator 272 may also include a signature (e.g., an MD5 or SHA value) that a decoder can use to confirm that a retrieved indexed dictionary and transformation set matches the one used by the encoder 260. The metadata generator 272 may also generate metadata that includes a mapping to associate determined context states with indexed dictionaries and transformation sets. In some implementations, the metadata generator 272 also generates metadata that defines the hash function used to determine a context state.

The encoded file generator 274 generates an encoded data file from the codewords generated by the codeword generator 270. In some implementations, the encoded data file is generated by concatenating the sequence of codewords generated by the codeword generator 270. In some implementations, the encoded file generator 274 also generates a file header that includes at least some of the metadata generated by the metadata generator 272. Additionally, the encoded file generator 274 may include a reference to a location in which the metadata can be retrieved. For example, if multiple data files are encoded using the same hash function for context states and the same mapping from context states to indexed dictionaries and transformation sets, the same metadata can be used for each of the files without being transmitted multiple times in the headers of each file. This additional compression efficiency may be particularly beneficial with smaller data files.

Figure 3:
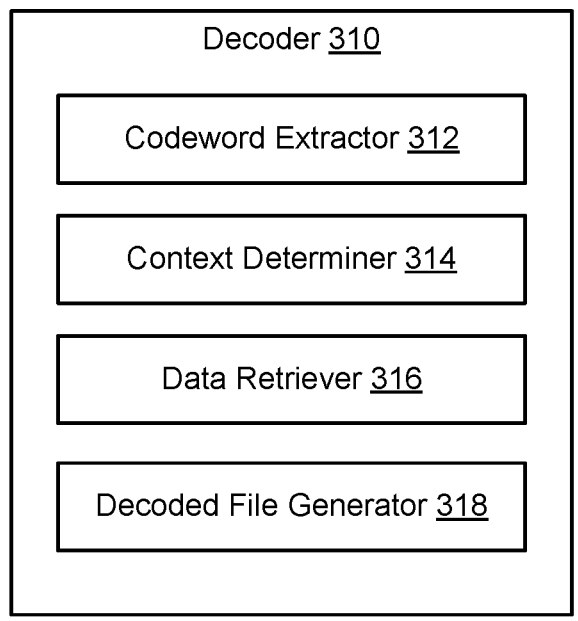
FIG. 3 is a schematic diagram of an example of the decoder of FIG. 1.

FIG. 3 is a schematic diagram of an example decoder 310. The decoder 310 is an example of the decoder 204. The decoder 310 decodes encoded data, such as encoded data files. In some implementations, the decoder 310 includes a codeword extractor 312, a context determiner 314, a data retriever 316, and a decoded file generator 318.

The codeword extractor 312 divides an encoded data source such as an encoded data file, into a sequence of codewords. This sequence of codewords can then be sequentially decoded. In some implementations, the codeword extractor 312 extracts codewords having variable lengths. The codeword extractor 312 may read a portion of the encoded data to determine the length of the codeword. The codeword extractor 312 can then extract the determined number of bits or bytes from the data source to treat as the codeword. The codeword extractor 312 can also extract codewords by comparing bits/bytes of the encoded data until a matching value from a prefix code is found. The extracted codewords can, for example, be stored in a list or array.

The context determiner 314 determines a context state for a target codeword to be decoded. The context determiner 314 may be similar to the context determiner 266 except that the context determiner 314 will use preceding data that has just been decoded to determine a context state. In some implementations, the context is determined based on the decoded data from one or more preceding codewords. For example, the context determiner 314 may apply a hash function to the last two bytes decoded prior to the target codeword. The context determiner 314 may access metadata associated with the encoded file to identify a hash function to apply to the preceding data to determine the context state.

The data retriever 316 retrieves matching data based on a target codeword that is being decoded. In some implementations, the data retriever 316 analyzes the codeword to extract a length of the decoded data from the codeword. The data retriever 316 may also determine an encoding method for the codeword (e.g., whether the codeword encodes with reference to a preceding portion of the string, with reference to a dictionary, or as a literal value. For codewords that are determined to be encoded as literal values, the data retriever 316 may extract the data from the codeword of the determined length. In some implementations, the literal values may be encoded using, for example, an entropy code such as a Huffman code.

For codewords that are determined to be coded with reference to a preceding portion of the data, the data retriever 316 retrieves a portion of the already decoded data starting at a location determined from an offset encoded in the codeword and having a length matching the determined length. For example, the data retriever 316 can extract an offset value from the target codeword that specifies how far back into the decoded data to go to retrieve the data.

For codewords that are determined to be coded with reference to an indexed dictionary, the data retriever 316 identifies the indexed dictionary based on the context state determined by the context determiner 314. In some implementations, the data retriever 316 also identifies a transformation set based on the context state. For example, the context determiner 314 may access metadata associated with the encoded file to identify an indexed dictionary and/or a transformation set associated with the determined context state.

The data retriever 316 then determines a word entry index into the identified indexed dictionary from the target codeword. In some implementations, the data retriever 316 also determines a transformation index into the identified transformation set. For example, the data retriever 316 extracts a numeric offset value from the target codeword. The data retriever 316 then calculates an excess offset value by subtracting the length of the preceding decoded data from the numeric offset value. This excess offset value is then converted to a word entry index and a transformation index. In some implementations, the excess offset value is used as the word entry index. In some implementations, the excess offset value is divided by the number of words in the identified indexed dictionary having the determined length, and the quotient is used as the transformation index, while the remainder is used as the word entry index. An example process for determining a word entry index and transformation index is illustrated and described with respect to FIG. 9. The data retriever 316 then uses the word entry index to retrieve the word from the identified indexed dictionary. In some implementations, the data retriever 316 retrieves a transformation from the identified transformation set and applies that transformation to the retrieved word entry.

The decoded file generator 318 generates a decoded file based on the data retrieved by the data retriever 316. For example, the decoded file generator 318 may sequentially write the data retrieved by the data retriever 316 for each of the codewords extracted by the codeword extractor 312. The decoded file generator 318 may be written to a file on a file system. The decoded file generator 318 may write the decode data file into a buffer in memory, a field in a database, or another location.

Figure 4:
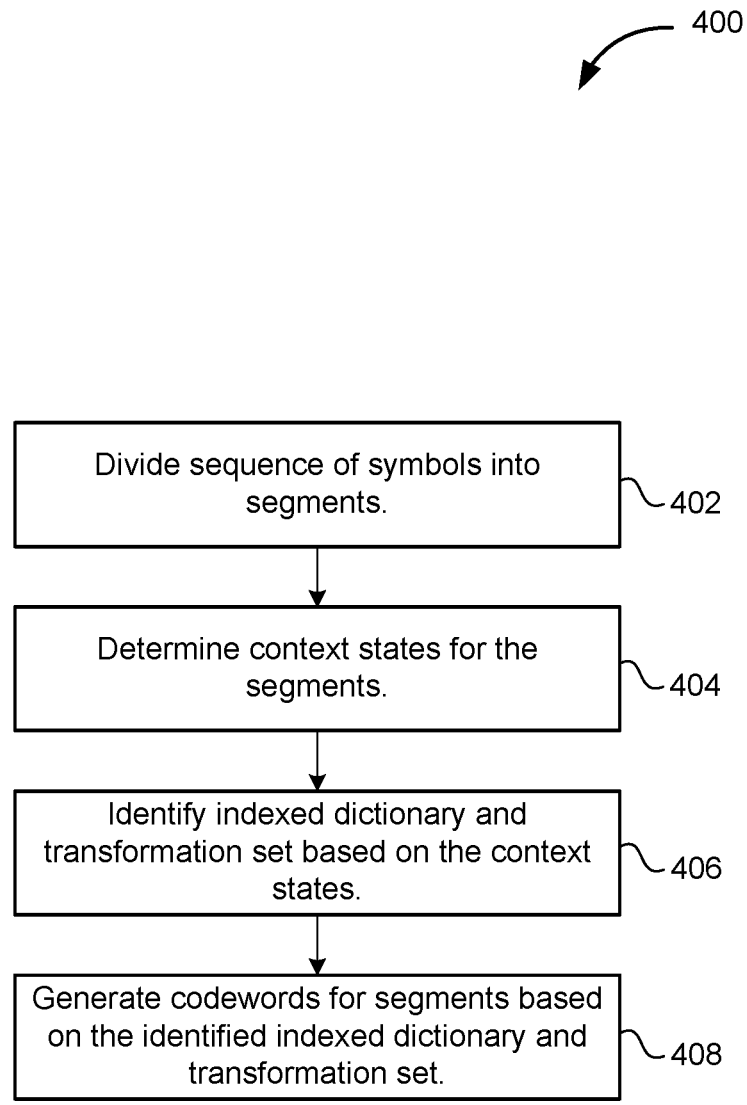
FIG. 4 is a flowchart showing a method for encoding data according to an example implementation.

FIG. 4 is a flowchart showing a method 400 for encoding data according to an example implementation. The method 400 may be performed by implementations of the encoder 260 to encode a data file such as the data file 112 or the data file 114. The order of operations shown in FIG. 4 is illustrative and in some implementations the operations may be performed in a different order.

At operation 402, the sequence of symbols is divided into segments. For example, the segments correspond to words from a lexicon and may include punctuation that precedes or follows a word from a lexicon. In some implementations, the sequence of symbols are divided based on the presence of specific delimiters (e.g., one or more spaces, commas, etc.).

At operation 404, a context state is determined for at least some of the segments. In some implementations, the context state is determined based on a context segment that includes at least a portion of the sequence that precedes the segment. For example, a function that hashes to a limited number (e.g., 2, 4, 8, 16, 32, 64, 128, or another number) of context states may be applied to a portion of the sequence that precedes the segment. In some implementations, a context state is determined for each of the segments. A default context state may be assigned to segments that are not preceded by another portion of the sequence (e.g., the first segment). In some implementations, a context state is determined for a segment after determining that the segment does not match a preceding portion of the sequence. In some implementations, at least two different context states are determined for different segments from a sequence (i.e., not all of the segments from a sequence are determined to have the same context state).

At operation 406, an indexed dictionary and a transformation set is identified for at least some of the segments based on the context determined for the segment at operation 404. In some implementations, a table storing a mapping from each of the potential context states to a particular indexed dictionary and/or transformation set is used to identify the indexed dictionary and/or transformation set for a segment. In some implementations, at least two different indexed dictionaries and/or two different transformation sets are identified context states are determined for the segments (i.e., multiple indexed dictionaries and/or transformation sets are identified for a sequence).

At operation 408, codewords are generated for the segments. For example, if a segment is determined to match a word entry in the identified indexed dictionary, a codeword referencing that word entry may be generated. Additionally, if it is determined that a transformation from the identified transformation set can be applied to cause a codeword to match a word entry from the identified indexed dictionary, a codeword referencing the word entry and the indexed dictionary may be generated. Codewords also can be generated to reference a preceding portion of the sequence or to represent literal values of at least one symbol. In at least some embodiments, the codewords do not include a reference to the indexed dictionary that includes the word entry and/or the transformation set that includes the transformation.

Figure 5:
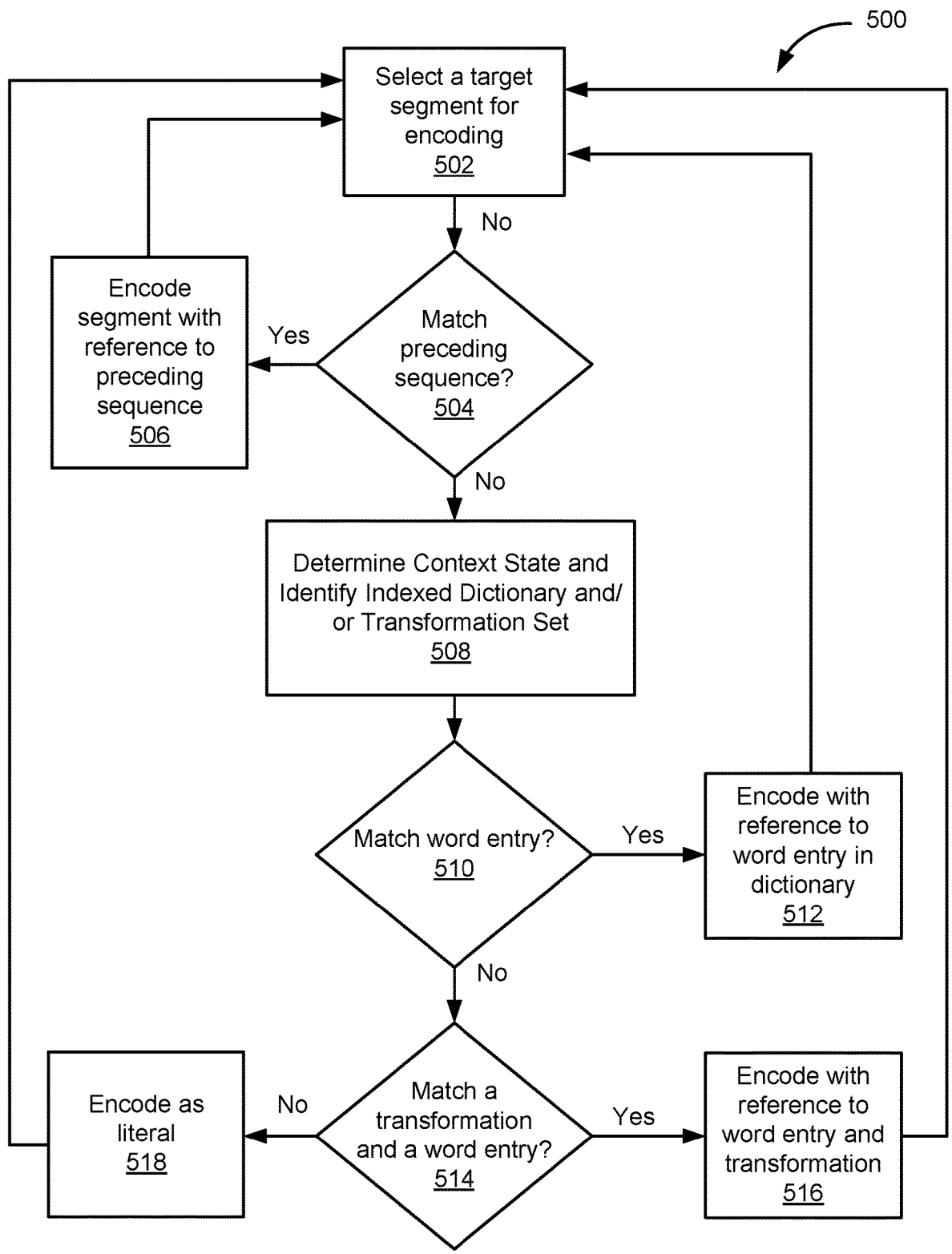
FIG. 5 is a flowchart showing a method for encoding a segment from a sequence of symbols.

FIG. 5 is a flowchart showing a method 500 for encoding a segment from a sequence of symbols. As described above, a segment may correspond to a word from a lexicon and may include preceding and/or following spaces and/or punctuation. The method 500 may be performed iteratively on each of the segments. The order of operations shown in FIG. 5 is illustrative and in some implementations the operations may be performed in a different order.

At operation 502, a target segment is selected for encoding. For example, the segments are processed sequentially in at least some implementations. The first time the method 500 is performed, the first segment is selected and then during each additional iteration of the method 500, the next segment is selected until all of the segments have been encoded.

At operation 504, it is determined whether the target segment matches a portion of the preceding sequence, which has been previously encoded. For example, the preceding sequence match determiner 264 may compare the target segment to at least a portion of the previously encoded sequence to determine whether the target segment can be encoded with reference to a preceding portion of the sequence. If so, the method proceeds to operation 506 where the target segment is encoded with reference to the preceding sequence. For example, a codeword that includes an offset into the preceding sequence and a length may be generated for the target segment. Additionally, in some implementations the generated codeword also includes an indicator that the target segment is encoded by reference.

If it is determined that the target segment does not match a preceding sequence, the method proceeds to operation 508. At operation 508, a context state is determined for the target sequence. As described previously, the context state may be determined based on a context portion of the preceding sequence. Then, an indexed dictionary and/or a transformation set is identified based on the determined context state.

At operation 510, it is determined whether target segment matches a word in the identified indexed database. In some embodiments, the word entries in a dictionary are grouped in sub-dictionaries based on the length of the word entries. In an example, the dictionary match determiner 268 determines whether the sub-dictionary for the appropriate length word entries of the identified indexed dictionary includes a word entry that matches the target segment.

If it is determined that the identified indexed dictionary includes a match, the method proceeds to operation 512, where the segment is encoded with reference to the word entry in the identified indexed dictionary. For example, an index value into the sub-dictionary for the appropriate length of the identified indexed dictionary may be determined and used in generating the codeword.

If it is determined at operation 510, that the target segment does not match a word entry in the identified indexed dictionary, then the method 500 may proceed to operation 514. At operation 514, it is determined whether the target segment matches a word entry from the identified indexed dictionary that has been transformed by one of the transformations from the identified transformation set. If so, the method proceeds to operation 516, where the target segment is encoded using the word entry and the transformation. For example, an index value into the sub-dictionary for the appropriate length of the identified indexed dictionary and an index value into the identified transformations set may be determined and used in generating the codeword.

If instead, it is determined that the target segment does not match a word entry from the identified indexed database even with a transformation from the identified transformation set applied, the method proceeds to operation 518. At operation 518, the target segment is encoded as a literal value. For example, the codeword may include an indicator that a literal encoding is being used and the symbols of the target segment. In some implementations, the literal encoding of the symbols may be generated by representing the symbols using an entropy code.

After encoding the target segment at operation 506, operation 516, or operation 518, the method 500 may return to operation 502 to select the next target segment for encoding. This process may continue until an entire sequence of symbols has been encoded.

Figure 6:
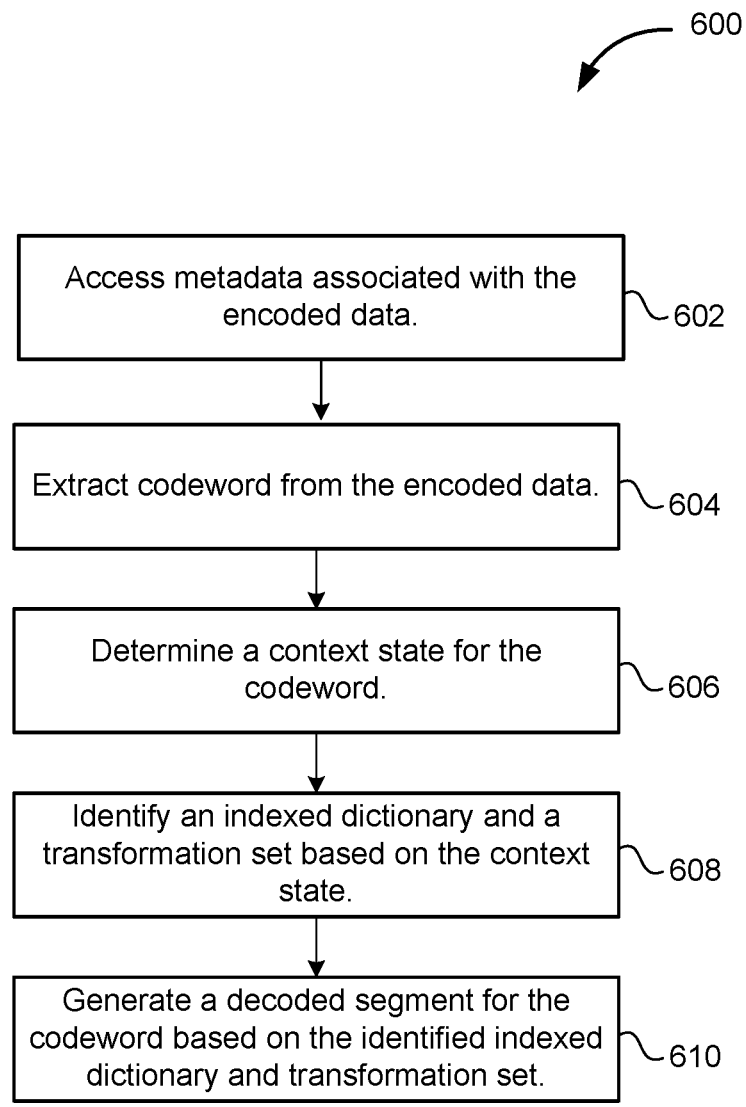
FIG. 6 is a flowchart showing a method for decoding data according to an example implementation.

FIG. 6 is a flowchart showing a method 600 for decoding data according to an example implementation. The method 600 may be performed by implementations of the decoder 310 to decode encoded data such as the encoded data file 150. The method 600 may be performed iteratively on multiple codewords in the encoded data. The order of operations shown in FIG. 6 is illustrative and in some implementations the operations may be performed in a different order.

At operation 602, metadata about the encoded data is accessed. For example, the metadata may define how a context state is determined for a codeword and how context states map to indexed dictionaries and transformation sets. In some embodiments, the metadata may be stored in a header of an encoded data file that includes the encoded data.

At operation 604, a codeword is extracted from the encoded data. As described above, the codewords may be of variable lengths in some implementations. Extracting the codeword from the encoded data may comprise determining the length of the codeword and extracting the corresponding portion of the data.

At operation 606, a context state is determined for a codeword. In some implementations, the context is determined based on one or more of the preceding decoded segments. For example, a hash function may be applied to the last two bytes of the preceding decoded segment to determine a context state for a code word. As another example, the length of the preceding decoded segment is used to determine a context state. As another example, the number of symbols in the preceding decoded segment until a particular delimiter or set of delimiters (e.g., a space or other white space symbol) is reached is used to determine a context. In some implementations, a default context state is assigned to a first codeword in the encoded data because it does not have a preceding segment.

At operation 608, an indexed dictionary and a transformation set are identified based on the determined context state. The indexed dictionary and transformation set are determined based on the metadata retrieved at operation 602 (e.g., by using the context state as an index into a look-up table that maps context states to indexed dictionaries and/or transformation sets).

At operation 610, a decoded segment is generated for the codeword based on the identified indexed dictionary and transformation set. For example, a transformation may be retrieved from the identified transformation set based on the codeword and then applied to a word entry that is retrieved from the indexed dictionary based on the codeword to generate the decoded segment.

Figure 7:
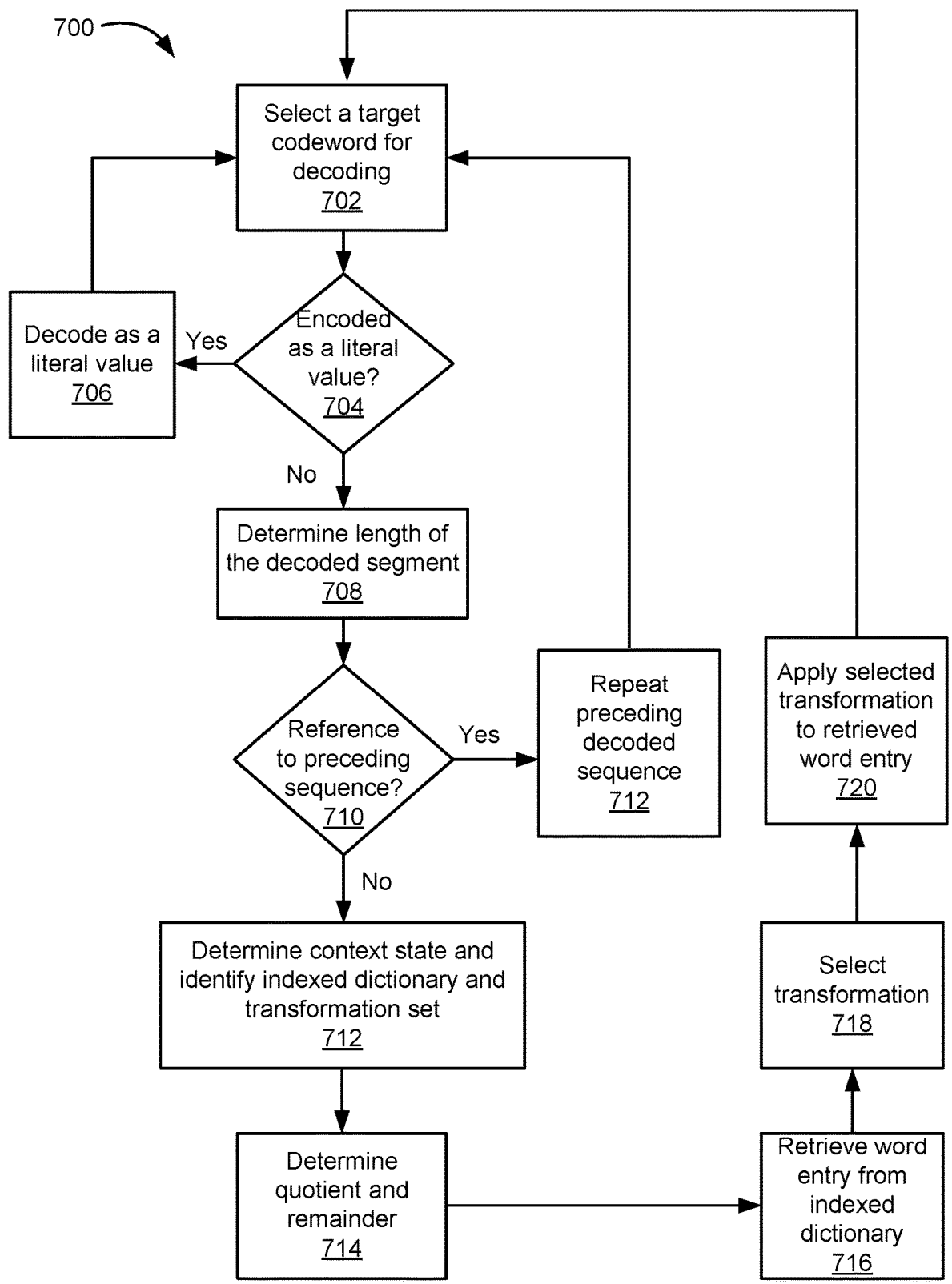
FIG. 7 is a flowchart showing a method for decoding a codeword to generate a decoded segment.

FIG. 7 is a flowchart showing a method 700 for decoding a codeword to generate a decoded segment. As described above, encoded data may include a sequence of codewords that correspond to segments of a sequence of symbols. The method 700 may be performed iteratively on each of the codewords to generate the decoded sequence. The order of operations shown in FIG. 7 is illustrative and in some implementations the operations may be performed in a different order.

At operation 702, a target codeword is selected for decoding. For example, the codewords of an encoded data file can be processed sequentially in at least some implementations. In some implementations, the first time the method 700 is performed, the first codeword is selected and then during each additional iteration of the method 700, the next codeword is selected until all of the codewords have been decoded.

At operation 704, it is determined whether the target codeword is encoded as a literal value. For example, an indicator value from the target codeword may be evaluated to determine that the codeword is encoded as a literal value. If so, the method proceeds to operation 706, where the codeword is decoded as a literal value. Decoding the literal value may include determining a length of the literal value and extracting a number of symbols corresponding to the determined length. In some implementations, the literal values are encoded using an entropy code.

If it is determined at operation 704 that the target codeword is not encoded as a literal value, the method 700 proceeds to operation 708. At operation 708, the length of the decoded sequence is determined. In some embodiments, a length value is read from the target codeword.

At operation 710, it is determined whether the target codeword includes a reference to a preceding sequence. In some implementations, a numeric offset value is determined from the target codeword. The numeric offset value is compared to the length of the preceding decoded sequence. If the numeric offset value is less than the length of the decoded preceding sequence, it is determined that the target codeword includes a reference to the preceding sequence and the method proceeds to operation 712. At operation 712, the preceding decoded sequence is repeated based on the numeric offset value. For example, the a portion of the decoded preceding sequence of the length determined at operation 708 that is offset into the preceding sequence by the numeric offset value is repeated.

If, instead, it is determined at operation 710 that the target codeword does not include a reference to the preceding sequence, the method proceeds to operation 712. At operation 712, a context state is determined and an indexed database and/or a transformation set is identified. For example, the context state may be determined by performing a hash function on a context portion of the decoded preceding sequence. The determined context state may then be mapped to an indexed database and/or a transformation set.

At operation 714, a quotient and a remainder are determined from the numeric offset value. For example, an excess offset value may be determined by subtracting the length of the decoded preceding sequence value from the numeric offset value. In some implementations, the quotient and remainder are then determined by dividing the excess offset value by the number of word entries of the determined length in the identified indexed database.

At operation 716, a word entry is retrieved from the identified indexed dictionary. In some embodiments, the remainder determined at operation 714 is used as an index into the identified indexed dictionary. In some implementations, the remainder is used as an index into a subdictionary of word entries having the length determined at operation 708 (i.e., both the determined length and the remainder are used as an index to retrieve the word entry).

At operation 718, a transformation is selected from the identified transformation set based on the quotient determined at operation 714. At operation 720, the selected transformation is applied to the retrieved word entry. In some implementations, the resulting transformed word entry is then appended to the decoded data.

After decoding the target codeword at operation 706, operation 712, or operation 720, the method 700 may return to operation 702 to select the next target codeword for decoding. This process may continue until an entire sequence of codewords from has been decoded.

Figure 8:
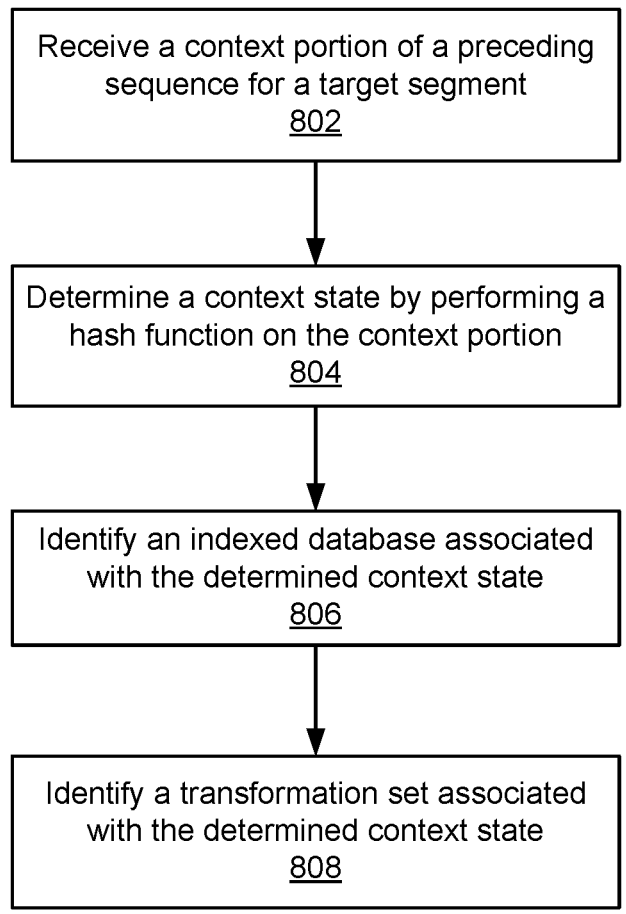
FIG. 8 is a flowchart showing a method for identifying a context-based indexed database and transformation set according to an example implementation.

FIG. 8 is a flowchart showing a method 800 for identifying a context-based indexed database and transformation set according to an example implementation. The method 800 may be performed by some implementations of the context determiner 266 of the encoder 260 and/or the context determiner 314 of the decoder 310. The order of operations shown in FIG. 8 is illustrative and in some implementations the operations may be performed in a different order.

At operation 802, a context portion of a preceding sequence for a target segment is determined. As described above, the context portion may be a predetermined size that immediately precedes the target segment.

At operation 804, a context state is determined by performing a hash function on the context portion. The hash function may map the context portion to a predetermined number (e.g., 64 or another number) of context states.

At operation 806, an indexed database associated with the determined context state is identified and at operation 808, a transformation set associated with the determined context state is identified. For example, a table may store a mapping from context states to indexed databases and transformation sets.

Figure 9:
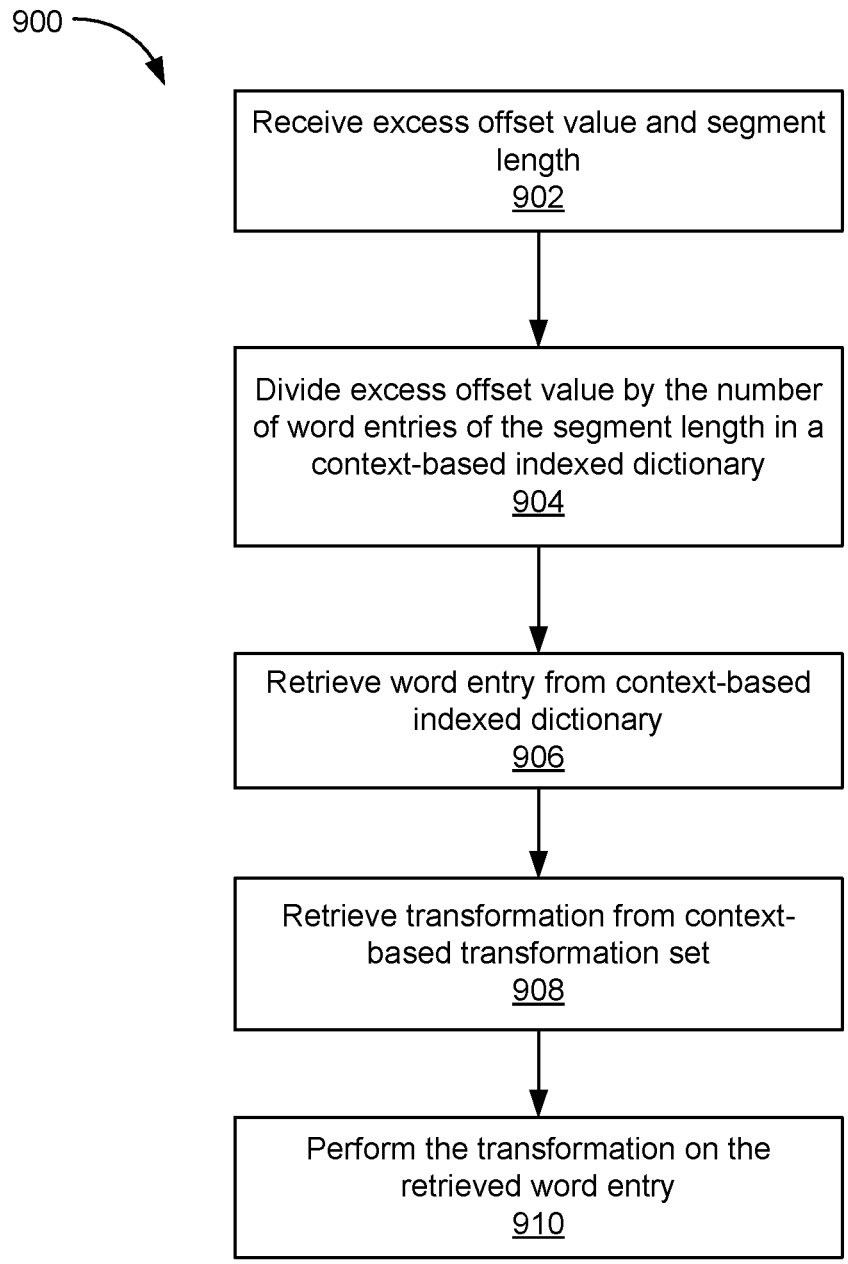
FIG. 9 is a flowchart showing a method 900 for decoding data according to an example implementation.

FIG. 9 is a flowchart showing a method 900 for decoding data according to an example implementation. The method 900 may be performed by some implementations of the decoder 310. The order of operations shown in FIG. 9 is illustrative and in some implementations the operations may be performed in a different order.

At operation 902, an excess offset value and segment length is determined. As described above, these values may be determined based on a codeword. In some implementations, the decoded segment length is extracted from the codeword. Additionally, in some implementations, the excess offset value is determined by subtracting the length of a preceding decoded sequence (or the length of decoding window) from a numeric offset value that is extracted from the codeword.

At operation 904, the excess offset value is divided by the number of words entries of the received segment length in the context-based indexed dictionary. As described previously, the context-based indexed dictionary can be determined according in various ways.

At operation 906, a word entry is retrieved from the context-based indexed dictionary based on the remainder of the division performed at operation 904. In some implementations, the remainder and the received segment length are used as indexes into the context-based indexed dictionary. In some implementations, the context-based indexed dictionary comprises multiple subdictionaries that each contain word entries of a particular length. The word entry may be retrieved using the remainder as an index into the appropriate subdictionary of the context-based indexed dictionary for the received segment length.

At operation 908, a transformation is retrieved from a context-based transformation set. In some implementations, the transformation is retrieved by using the quotient of the division performed in operation 904 as an index into the context-based transformation set.

At operation 910, the retrieved transformation is applied to the retrieved word entry to generated the decoded data for the codeword. The transformed word entry may then be stored in a file system, a buffer, or sent to another computing device.

Figure 10:
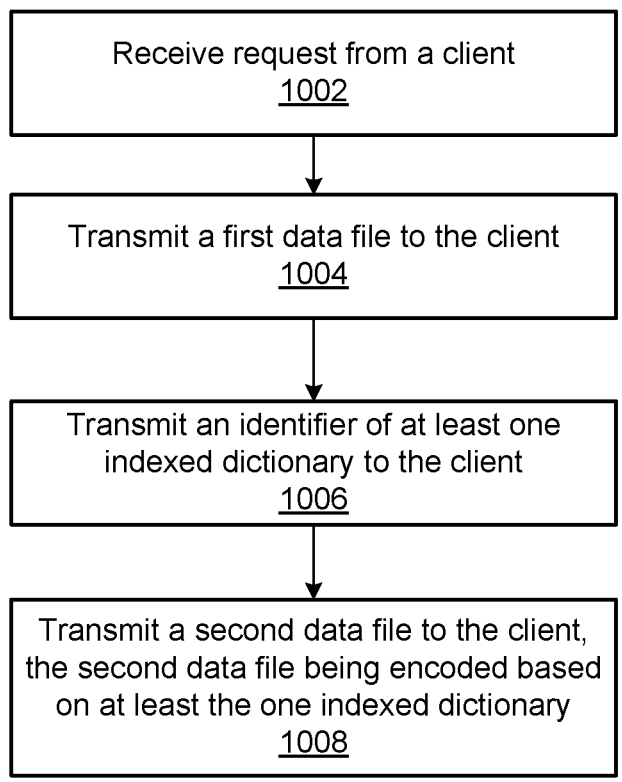
FIG. 10 is a flowchart showing a method 1000 for transmitting multiple data files to a client according to an example implementation.

FIG. 10 is a flowchart showing a method 1000 for transmitting multiple data files to a client according to an example implementation. The method 1000 may be performed by some implementations of the data server 106. The order of operations shown in FIG. 10 is illustrative and in some implementations the operations may be performed in a different order.

At operation 1002, a request is received from a client. For example, the request may be for web content and may be received from a web browser. The request may include information about indexed dictionaries and transformation sets that are currently available on the client.

At operation 1004, a first data file is transmitted to the client. In some implementations, the first data file is not encoded. In some implementations, the first data file is encoded in a manner that does not require the client to retrieve additional indexed dictionaries or transformation sets. For example, the first data file may be encoded without reference to any indexed dictionaries or transformation sets. As another example, the first data file may be encoded with reference to only those dictionaries and transformation sets the client indicated having currently available. The client may then render or otherwise present the first data file.

At operation 1006, an indicator of at least one indexed dictionary is transmitted to the client. For example, the indicator can include a URL at which the indexed dictionary can be retrieved. The client may then use this indicator to retrieve the indexed dictionary. In a similar manner, an indicator of at least one transformation set may be transmitted to the client so that the client can retrieve the transformation set.

At operation 1008, a second data file is transmitted. The second file is encoded based on the at least one indexed dictionary. In some implementations, the second file is encoded based on multiple indexed dictionaries based on context throughout the file. The second file may be transmitted as part of the response to the request received at operation 1002. Alternatively, the second file may be transmitted in response to a second request from the client.

The method 1000 allows the client to more quickly receive an initial response to a request by not encoding with indexed dictionaries that are not available to the client. In this manner, the client can decode the response without any additional delay that may be required to retrieve additional indexed databases. Then, because the client can retrieve the identified indexed dictionaries after receiving the response to the first request, the client may then be equipped to decode future responses that are encoded with reference to the additional indexed dictionaries. The additional dictionaries may, for example, allow for a higher rate of compression.

Figure 11:
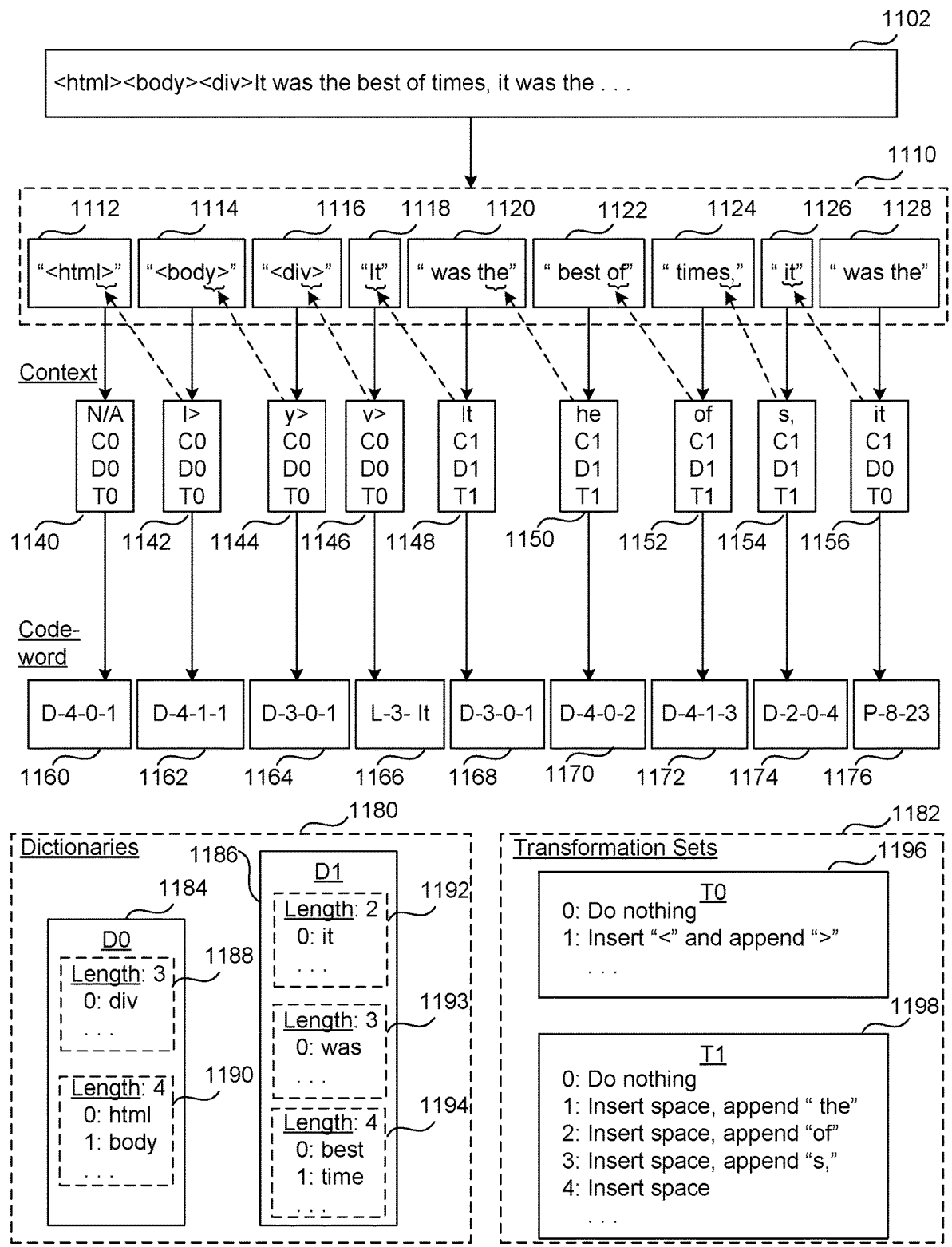
FIG. 11 is a block diagram showing an example of a portion of a sequence of characters being encoded according to an example implementation.

FIG. 11 is a block diagram showing an example of a portion 1102 of a sequence of characters being encoded according to an example implementation. The portion 1102 can, for example, be from a data file that contains a sequence of characters. In this example, the portion 1102 includes markup tags (e.g., "<html>", "<body>", "<div>") and a string of text ("It was the best of times, it was the").

The portion 1102 is divided into a plurality 1110 of segments by, for example, the sequence segmenter 262. In this example, the segments comprise markup tags, words, or groups of words. As shown, at least some of the segments also include preceding and/or following spaces and/or punctuation. In some of the segments a word is grouped with a second word when the second word occurs frequently, such as when the second word is an article or preposition. In this example, the segment 1112 includes the sequence "<html>", the segment 1114 includes the sequence "<body>", the segment 1116 includes the sequence "<div>", the segment 1118 includes the sequence "It", the segment 1120 includes the sequence "was the", the segment 1122 includes the sequence "best of", the segment 1124 includes the sequence "times," the segment 1126 includes the sequence "it," and the segment 1128 includes the sequence "was the".

In some implementations, each of the plurality 1110 of segments is encoded into a codeword based on a determined context. For example, the context determiner 266, can determine the context based on a context portion that includes the last two symbols of the preceding segment. Then, a context-based indexed dictionary and a transformation set can be identified based on the context by, for example, the context determiner 266. In this example, the context determiner 266 identifies an indexed dictionary from a plurality 1180 of indexed dictionaries, including the indexed dictionary 1184 (also referred to as D0 herein) and the indexed dictionary 1186 (also referred to as D1 herein), and a transformation set from a plurality 1182 of transformation sets, including the transformation set 1196 (also referred to as T0 herein) and the transformation set 1198 (also referred to as T1 herein). In this example, the indexed dictionary 1184 (D0) includes a sub-dictionary 1188 of word entries having three symbols and a sub-dictionary 1190 of word entries having four symbols. Similarly, the indexed dictionary 1186 (D1) includes a sub-dictionary 1192 of word entries having two symbols, a sub-dictionary 1193 of word entries having three symbols, and a sub-dictionary 1194 of word entries having four symbols.

In this example, a context segment is not available (shown as N/A in context information 1140) for segment 1112 because the segment 1112 is first and the portion 1102 does not include a segment that precedes segment 1112. In this example, the context determiner 266 assigns a context of C0 to the segment 1112 as a default and identifies the indexed dictionary 1184 (D0) and a transformation set 1196 (T0) based on that context C0. The dictionary match determiner 268 then searches the identified indexed dictionary 1184 (D0) and the identified transformation set 1196 (T0) for matches. In this case, the dictionary match determiner 268, determines that the segment 1112 matches the word entry with index 0 ("html") in the sub-dictionary 1190 when the transformation with index 1 in the transformation set 1196 (T0) is applied (insert "<" and append ">"). Based on this match, a codeword 1160 with an illustrative value of "D-4-0-1" is generated by, for example, the codeword generator 270. In this case, the codeword 1160 indicates that the segment 1112 is encoded with reference to a dictionary (indicated by the letter D), matches a word entry of length 4 (indicated by the number 4), having a word entry index value of 0 (indicated by the number 0), and a transformation set index value of 1 (indicated by the number 1).

Continuing this example, the segment 1114 is associated with context information 1142. In this example, the context segment for the segment 1114 is "1>", which are the last two characters of the preceding segment, the segment 1112. The context determiner 266 applies a function to the context segment "1>" to determine to associate the segment 1114 with the context C0 and identifies the indexed dictionary 1184 (D0) and a transformation set 1196 (T0) based on that context C0. The dictionary match determiner 268 then searches the identified indexed dictionary 1184 (D0) and the identified transformation set 1196 (T0) for matches. In this case, the dictionary match determiner 268, determines that the segment 1114 matches the word entry with index 1 ("body") in the sub-dictionary 1190 when the transformation with index 1 in the transformation set 1196 (T0) is applied (insert "<" and append ">"). Based on this match, a codeword 1162 with an illustrative value of "D-4-1-1" is generated by, for example, the codeword generator 270. In this case, the codeword 1162 indicates that the segment 1114 is encoded with reference to a dictionary (indicated by the letter D), matches a word entry of length 4 (indicated by the number 4), having a word entry index value of 1 (indicated by the number 1), and a transformation set index value of 1 (indicated by the number 1).

Continuing this example, the segment 1116 is associated with context information 1144. In this example, the context segment for the segment 1116 is "y>", which are the last two characters of the preceding segment, the segment 1114. The context determiner 266 applies a function to the context segment "y>" to determine to associate the segment 1116 with the context C0 and identifies the indexed dictionary (D0) and a transformation set (T0) based on that context C0. The dictionary match determiner 268 then searches the identified indexed dictionary 1184 (D0) and the identified transformation set 1196 (T0) for matches. In this case, the dictionary match determiner 268, determines that the segment 1116 matches the word entry with index 0 ("div") in the sub-dictionary 1188 when the transformation with index 1 in the transformation set 1196 (T0) is applied (insert "<" and append ">"). Based on this match, a codeword 1164 with an illustrative value of "D-3-0-1" is generated by, for example, the codeword generator 270. In this case, the codeword 1164 indicates that the segment 1116 is encoded with reference to a dictionary (indicated by the letter D), matches a word entry of length three symbols (indicated by the number 3), having a word entry index value of 0 (indicated by the number 0), and a transformation set index value of 1 (indicated by the number 1).

Continuing this example, the segment 1118 is associated with context information 1146. In this example, the context segment for the segment 1118 is "v>", which are the last two characters of the preceding segment, the segment 1116. The context determiner 266 applies a function to the context segment "v>" to determine to associate the segment 1118 with the context C0 and identifies the indexed dictionary 1184 (D0) and a transformation set 1196 (T0) based on that context C0. The dictionary match determiner 268 then searches the identified indexed dictionary 1184 (D0) and the identified transformation set 1196 (T0) for matches. In this case, the dictionary match determiner 268, determines that the segment 1116 does not match any of the word entries in the indexed dictionary 1184 (D0) even when transformations from the transformation set 1196 (T0) are applied. It may also be determined by, for example, the preceding sequence match determiner 264 that the preceding sequence match determiner 264 that the segment 1118 does not match any preceding sequences. It is then determined that the segment 1118 should be encoded as a literal value. A codeword 1166 with an illustrative value of "L-3-It" is generated by, for example, the codeword generator 270. In this case, the codeword 1166 indicates that the segment 1118 is encoded as a literal value (indicated by the letter L), has a length of three symbols (indicated by the number 3), and a value of "It".

Continuing this example, the segment 1120 is associated with context information 1148. In this example, the context segment for the segment 1120 is "It", which are the last two characters of the preceding segment, the segment 1118. The context determiner 266 applies a function to the context segment "It" to determine to associate the segment 1120 with the context C1 and identifies the indexed dictionary 1186 (D1) and a transformation set 1198 (T1) based on that context C1. The dictionary match determiner 268 then searches the identified indexed dictionary 1186 (D1) and the identified transformation set 1196 (T1) for matches. In this case, the dictionary match determiner 268, determines that the segment 1120 matches the word entry with index 0 ("was") in the sub-dictionary 1193 when the transformation with index 1 in the transformation set 1196 (T0) is applied (insert space, and append "the"). Based on this match, a codeword 1168 with an illustrative value of "D-3-0-1" is generated by, for example, the codeword generator 270. In this case, the codeword 1168 indicates that the segment 1120 is encoded with reference to a dictionary (indicated by the letter D), matches a word entry of length three symbols (indicated by the number 3), having a word entry index value of 0 (indicated by the number 0), and a transformation set index value of 1 (indicated by the number 1). Although the value of codeword 1168 ("D-3-0-1") is the same as the value of the codeword 1164 ("D-3-0-1"), the codeword 1168 will decode to "was the" based on the context C1, while the codeword 1164 will decode to "<div>" based on the context C0.

Continuing this example, the segment 1122 is associated with context information 1150. In this example, the context segment for the segment 1122 is "he", which are the last two characters of the preceding segment, the segment 1120. The context determiner 266 applies a function to the context segment "he" to determine to associate the segment 1122 with the context C1 and identifies the indexed dictionary 1186 (D1) and a transformation set 1198 (T1) based on that context C1. The dictionary match determiner 268 then searches the identified indexed dictionary 1186 (D1) and the identified transformation set 1196 (T1) for matches. In this case, the dictionary match determiner 268, determines that the segment 1122 matches the word entry with index 0 ("best") in the sub-dictionary 1194 when the transformation with index 2 in the transformation set 1196 (T0) is applied (insert space, and append "of"). Based on this match, a codeword 1170 with an illustrative value of "D-4-0-2" is generated by, for example, the codeword generator 270. In this case, the codeword 1170 indicates that the segment 1122 is encoded with reference to a dictionary (indicated by the letter D), matches a word entry of length four symbols (indicated by the number 4), having a word entry index value of 0 (indicated by the number 0), and a transformation set index value of 2 (indicated by the number 2).

Continuing this example, the segment 1124 is associated with context information 1152. In this example, the context segment for the segment 1124 is "of", which are the last two characters of the preceding segment, the segment 1122. The context determiner 266 applies a function to the context segment "of" to determine to associate the segment 1124 with the context C1 and identifies the indexed dictionary 1186 (D1) and a transformation set 1198 (T1) based on that context C1. The dictionary match determiner 268 then searches the identified indexed dictionary 1186 (D1) and the identified transformation set 1196 (T1) for matches. In this case, the dictionary match determiner 268, determines that the segment 1124 matches the word entry with index 1 ("time") in the sub-dictionary 1194 when the transformation with index 3 in the transformation set 1196 (T0) is applied (insert space, and append "s,"). Based on this match, a codeword 1172 with an illustrative value of "D-4-1-3" is generated by, for example, the codeword generator 270. In this case, the codeword 1172 indicates that the segment 1124 is encoded with reference to a dictionary (indicated by the letter D), matches a word entry of length four symbols (indicated by the number 4), having a word entry index value of 1 (indicated by the number 1), and a transformation set index value of 3 (indicated by the number 3).

Continuing this example, the segment 1126 is associated with context information 1154. In this example, the context segment for the segment 1126 is "s,", which are the last two characters of the preceding segment, the segment 1124. The context determiner 266 applies a function to the context segment "s," to determine to associate the segment 1126 with the context C1 and identifies the indexed dictionary 1186 (D1) and a transformation set 1198 (T1) based on that context C1. The dictionary match determiner 268 then searches the identified indexed dictionary 1186 (D1) and the identified transformation set 1196 (T1) for matches. In this case, the dictionary match determiner 268, determines that the segment 1124 matches the word entry with index 0 ("it") in the sub-dictionary 1192 when the transformation with index 4 in the transformation set 1196 (T0) is applied (insert space). Based on this match, a codeword 1174 with an illustrative value of "D-2-0-4" is generated by, for example, the codeword generator 270. In this case, the codeword 1174 indicates that the segment 1126 is encoded with reference to a dictionary (indicated by the letter D), matches a word entry of length two symbols (indicated by the number 2), having a word entry index value of 0 (indicated by the number 0), and a transformation set index value of 4 (indicated by the number 4). Although the segment 1118 and the segment 1126 both include the word it, only the segment 1126 was encoded with reference to a dictionary value because the segment 1126 was associated with the context C1 and the dictionary D1 that included a matching word entry. In contrast, the segment 1118 was associated with the context C0 (based on the preceding segment 1116) and the dictionary D1, which did not contain a matching word entry.

Continuing this example, the segment 1128 is determined to match a portion of the preceding sequence by, for example, the preceding sequence match determiner 264. Based on this match, a codeword 1176 with an illustrative value of "P-8-23" is generated by, for example, the codeword generator 270. In this case, the codeword 1174 indicates that the segment 1128 is encoded with reference to the preceding sequence (indicated by the letter P), and matches a portion of length eight symbols (indicated by the number 8) that begins twenty-three symbols before the beginning of segment 1128 (indicated by the number 23).

Although not all implementations generate context information when a match to a preceding sequence is determined, context information 1158 for the segment 1128 is shown in this example. In this example, the context segment for the segment 1128 is "it", which are the last two characters of the preceding segment, the segment 1126. The context determiner 266 applies a function to the context segment "it" to determine to associate the segment 1128 with the context C1 and identifies the indexed dictionary 1186 (D1) and a transformation set 1198 (T1) based on that context C1. In some implementations, the transformations from the identified transformation set 1198 (T1) may be applied to portions of the preceding sequence to determine whether the segment 1128 matches the preceding sequence.

Additionally, in some implementations, the dictionary match determiner 268 searches the identified indexed dictionary 1186 (D1) and the identified transformation set 1196 (T1) for matches. If a match is found, the amount of data required to encode with respect to a dictionary entry is determined and compared to the amount of data required to encode the segment with reference to a portion of the preceding sequence. The codeword generator can then generate the more efficient codeword.

The example codewords 1160, 1162, 1164, 1166, 1168, 1170, 1172, 1174, and 1176 are shown in an example format that illustrates that types of data stored in at least some implementations. However, in some implementations, the data stored in the codewords is stored in a more compact format. For example, a single bit may be used as an indicator to distinguish between codewords that store literal values and codewords that store by reference to either a dictionary or a preceding sequence. Additionally, entropy codes can be used to store the length and/or the indicator. Furthermore, in some implementations, the word entry index and the transformation index are combined into a single numerical value (e.g., as an excess offset value as described above). In some implementations, the offset value or the excess offset value is encoded using an entropy code too. Because an indexed dictionary is selected from multiple indexed dictionaries based on context, each of the indexed dictionaries can include fewer entries than would be included in a single dictionary. Because there are fewer entries, the entropy codes can be shorter that would be needed to encoded indexes into larger dictionaries that have more entries.

Figure 12:
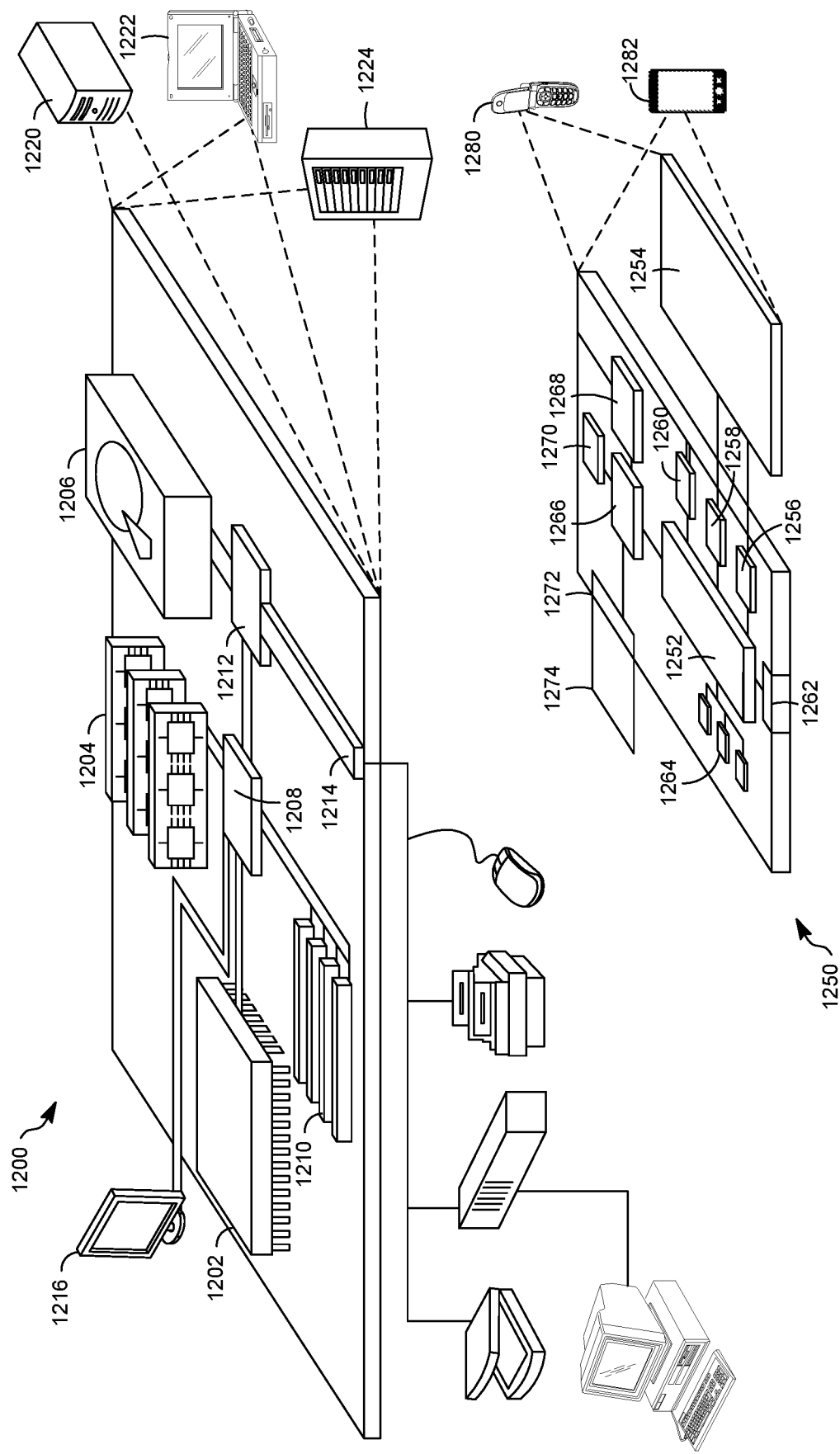
FIG. 12 shows an example of a generic computer device and a generic mobile computer device which may be used with the techniques described herein.

FIG. 12 shows an example of a generic computing device 1200 and a generic mobile computing device 1250, which may be used with the techniques described herein. Computing device 1200 is intended to represent various forms of digital computers, such as laptops, desktops, workstations, personal digital assistants, servers, blade servers, mainframes, and other appropriate computers. Computing device 1250 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 1200 includes a processor 1202, memory 1204, a storage device 1206, a high-speed interface 1208 connecting to memory 1204 and high-speed expansion ports 1210, and a low speed interface 1212 connecting to low speed bus 1214 and storage device 1206. Each of the components 1202, 1204, 1206, 1208, 1210, and 1212, are interconnected using various busses, and may be mounted on a common motherboard or in other manners as appropriate. The processor 1202 can process instructions for execution within the computing device 1200, including instructions stored in the memory 1204 or on the storage device 1206 to display graphical information for a GUI on an external input/output device, such as display 1216 coupled to high speed interface 1208. In other implementations, multiple processors and/or multiple buses may be used, as appropriate, along with multiple memories and types of memory. Also, multiple computing devices 1200 may be connected, with each device providing portions of the necessary operations (e.g., as a server bank, a group of blade servers, or a multi-processor system).

The memory 1204 stores information within the computing device 1200. In one implementation, the memory 1204 is a volatile memory unit or units. In another implementation, the memory 1204 is a non-volatile memory unit or units. The memory 1204 may also be another form of computer-readable medium, such as a magnetic or optical disk.

The storage device 1206 is capable of providing mass storage for the computing device 1200. In one implementation, the storage device 1206 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 1204, the storage device 1206, or memory on processor 1202.

The high speed controller 1208 manages bandwidth-intensive operations for the computing device 1200, while the low speed controller 1212 manages lower bandwidth-intensive operations. Such allocation of functions is exemplary only. In one implementation, the high-speed controller 1208 is coupled to memory 1204, display 1216 (e.g., through a graphics processor or accelerator), and to high-speed expansion ports 1210, which may accept various expansion cards (not shown). In the implementation, low-speed controller 1212 is coupled to storage device 1206 and low-speed expansion port 1214. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 1200 may be implemented in a number of different forms, as shown in the figure. For example, it may be implemented as a standard server 1220, or multiple times in a group of such servers. It may also be implemented as part of a rack server system 1224. In addition, it may be implemented in a personal computer such as a laptop computer 1222. Alternatively, components from computing device 1200 may be combined with other components in a mobile device (not shown), such as device 1250. Each of such devices may contain one or more of computing device 1200, 1250, and an entire system may be made up of multiple computing devices 1200, 1250 communicating with each other.

Computing device 1250 includes a processor 1252, memory 1264, an input/output device such as a display 1254, a communication interface 1266, and a transceiver 1268, among other components. The device 1250 may also be provided with a storage device, such as a microdrive or other device, to provide additional storage. Each of the components 1250, 1252, 1264, 1254, 1266, and 1268, are interconnected using various buses, and several of the components may be mounted on a common motherboard or in other manners as appropriate.

The processor 1252 can execute instructions within the computing device 1250, including instructions stored in the memory 1264. The processor may be implemented as a chipset of chips that include separate and multiple analog and digital processors. The processor may provide, for example, for coordination of the other components of the device 1250, such as control of user interfaces, applications run by device 1250, and wireless communication by device 1250.

Processor 1252 may communicate with a user through control interface 1258 and display interface 1256 coupled to a display 1254. The display 1254 may be, for example, a TFT LCD (Thin-Film-Transistor Liquid Crystal Display) or an OLED (Organic Light Emitting Diode) display, or other appropriate display technology. The display interface 1256 may comprise appropriate circuitry for driving the display 1254 to present graphical and other information to a user. The control interface 1258 may receive commands from a user and convert them for submission to the processor 1252. In addition, an external interface 1262 may be provide in communication with processor 1252, so as to enable near area communication of device 1250 with other devices. External interface 1262 may provide, for example, for wired communication in some implementations, or for wireless communication in other implementations, and multiple interfaces may also be used.

The memory 1264 stores information within the computing device 1250. The memory 1264 can be implemented as one or more of a computer-readable medium or media, a volatile memory unit or units, or a non-volatile memory unit or units. Expansion memory 1274 may also be provided and connected to device 1250 through expansion interface 1272, which may include, for example, a SIMM (Single In Line Memory Module) card interface. Such expansion memory 1274 may provide extra storage space for device 1250, or may also store applications or other information for device 1250. Specifically, expansion memory 1274 may include instructions to carry out or supplement the processes described above, and may include secure information also. Thus, for example, expansion memory 1274 may be provide as a security module for device 1250, and may be programmed with instructions that permit secure use of device 1250. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 1264, expansion memory 1274, or memory on processor 1252, that may be received, for example, over transceiver 1268 or external interface 1262.

Device 1250 may communicate wirelessly through communication interface 1266, which may include digital signal processing circuitry where necessary. Communication interface 1266 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 1268. In addition, short-range communication may occur, such as using a Bluetooth, WiFi, or other such transceiver (not shown). In addition, GPS (Global Positioning System) receiver module 1270 may provide additional navigation- and location-related wireless data to device 1250, which may be used as appropriate by applications running on device 1250.

Device 1250 may also communicate audibly using audio codec 1260, which may receive spoken information from a user and convert it to usable digital information. Audio codec 1260 may likewise generate audible sound for a user, such as through a speaker, e.g., in a handset of device 1250. Such sound may include sound from voice telephone calls, may include recorded sound (e.g., voice messages, music files, etc.) and may also include sound generated by applications operating on device 1250.

The computing device 1250 may be implemented in a number of different forms, as shown in the figure. For example, it may be implemented as a cellular telephone 1280. It may also be implemented as part of a smart phone 1282, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any non-transitory computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the invention.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

EXAMPLE 1

A non-transitory computer-readable storage medium comprising instructions stored thereon that, when executed by at least one processor, are configured to cause a computing system to at least: determine, for a first segment in a data file, a first context state based on a first context segment within data file that precedes the first segment; identify a first indexed dictionary from a plurality of indexed dictionaries based on the first context state; and encode the first segment using the identified first indexed dictionary.

EXAMPLE 2

The non-transitory computer-readable storage medium of example 1, wherein the instructions are further configured to cause the computing system to: determine, for a second segment in the data file, a second context state, wherein the second context state is determined based on a second context segment within the data file that precedes the second segment; identify, based on the second determined context state, a second indexed dictionary from the plurality of indexed dictionaries, the second indexed dictionary being different than the first indexed dictionary; and encode the second segment using the identified second indexed dictionary.

EXAMPLE 3

The non-transitory computer-readable storage medium of one of examples 1 or 2, wherein the first context segment comprises two bytes.

EXAMPLE 4

The non-transitory computer-readable storage medium of example 3, wherein the first context segment comprises two bytes immediately preceding the first context segment.

EXAMPLE 5

The non-transitory computer-readable storage medium of one of examples 1 to 4, wherein the first segment comprises a sequence of symbols.

EXAMPLE 6

The non-transitory computer-readable storage medium of example 5, wherein the sequence of symbols includes American Standard Code for Information Interchange (ASCII) characters.

EXAMPLE 7

The non-transitory computer-readable storage medium of example 5, wherein the sequence of symbols includes Unicode characters.

EXAMPLE 8

The non-transitory computer-readable storage medium of one of examples 5 to 7, wherein the sequence of symbols represents a word in a lexicon.

EXAMPLE 9

The non-transitory computer readable storage medium of example 8, wherein the first indexed dictionary comprises sequences of symbols and transforms.

EXAMPLE 10

The non-transitory computer-readable storage medium of example 9, wherein the first indexed dictionary is indexed for individual words from a lexicon.

EXAMPLE 11

A method comprising: receiving an encoded data file that includes a plurality of codewords; decoding a first codeword from the plurality of codewords; after decoding the first codeword, determining a first context for a second codeword from the plurality of codewords based on at least a portion of the decoded first codeword; identifying, based on the first context state, a first indexed dictionary from a plurality of indexed dictionaries; and decoding the second codeword using the identified first indexed dictionary.

EXAMPLE 12

The method of example 11, further comprising: determining, for a third codeword from the plurality of codewords, a second context state based on a second context segment within the data block that precedes the second segment; identifying a second indexed dictionary from the plurality of indexed dictionaries based on the second determined context state, the second indexed dictionary being different than the first indexed dictionary; and decoding the third codeword using the identified second indexed dictionary.

EXAMPLE 13

The method of example 11 or 12, wherein the first context state is determined based on the last two bytes of the decoded first codeword.

EXAMPLE 14

The method of one of examples 11 to 13, further comprising: retrieving metadata associated with the encoded data file.

EXAMPLE 15

The method of example 14, wherein the metadata includes a hash function usable to determine a context state for codewords in the encoded data file.

EXAMPLE 16

The method of example 14 or 15, wherein the metadata includes a mapping from a plurality of context states to a plurality of indexed dictionaries.

EXAMPLE 17

The method of example 16, wherein the metadata further includes a mapping from a plurality of context states to a plurality of transaction sets.

EXAMPLE 18

The method of one of examples 11 to 17, wherein decoding the second codeword using the identified first indexed dictionary comprises: extracting a sequence length from the second codeword; determining a word entry index from the second codeword; and retrieving a word entry from the identified indexed dictionary using the sequence length and word entry index.

EXAMPLE 19

A computer system comprising: at least one processor; and memory storing instructions that, when executed by the at least one processor, cause the system to: determine, for a first segment in a data file, a first context state based on a first context segment within the data file that precedes the first segment; identify, based on the determined first context state, a first indexed dictionary from a plurality of indexed dictionaries; identify, based on the determined first context state, a first transformation set from a plurality of transformation sets; encode the first segment using the identified first indexed dictionary and the identified first transformation set; determine, for a second segment in the data file, a second context state based on a second context segment within the data file that precedes the second segment; identify, based on the determined second context state, a second indexed dictionary from the plurality of indexed dictionaries, the second indexed dictionary being different than the first indexed dictionary; identify, based on the determined second context state, a second transformation set from a plurality of transformation sets based on the second context state, the second transformation set being different than the first transformation set; and encode the second segment using the identified second indexed dictionary and the identified second transformation set.

EXAMPLE 20

The computer system of example 19, the instructions that cause the system to encode the first segment using the identified first indexed dictionary and the identified first transformation set, comprise instructions that cause the system to: identify a word entry in the identified first indexed dictionary and a transformation in the identified first transformation such that the result of applying the identified transformation to the identified word entry matches the first segment.

What is claimed is:

1. A non-transitory computer-readable storage medium comprising instructions stored thereon that, when executed by at least one processor, are configured to cause a computing system to at least:
   determine, for a first segment in a data file, a first context state based on a first context segment within the data file, the first context segment including two bytes that precede the first segment in the data file;
   identify a first indexed dictionary for the first context state from a plurality of indexed dictionaries;
   identify a first transformation set for the first context state from a plurality of transformation sets, wherein the first transformation set includes at least one entry that includes two sets of predefined characters, a first set of the two sets representing a predefined character to insert before an entry in the first indexed dictionary and a second set of the two sets representing a predefined character to append after the entry in the first indexed dictionary; and
   encode the first segment using the first indexed dictionary and the first transformation set.

2. The non-transitory computer-readable storage medium of claim 1, wherein the instructions are further configured to cause the computing system to:
   determine, for a second segment in the data file, a second context state, wherein the second context state is determined based on a second context segment within the data file that precedes the second segment;
   identify, based on the second context state, a second indexed dictionary from the plurality of indexed dictionaries, the second indexed dictionary being different than the first indexed dictionary; and
   encode the second segment using the second indexed dictionary.

3. The non-transitory computer-readable storage medium of claim 1, wherein the first context state is determined based on a hash of the first context segment.

4. The non-transitory computer-readable storage medium of claim 1, wherein the first segment includes a sequence of American Standard Code for Information Interchange (ASCII) characters.

5. The non-transitory computer-readable storage medium of claim 1, wherein the first segment includes a sequence of Unicode characters.

6. The non-transitory computer-readable storage medium of claim 1, wherein the first segment includes a word in a lexicon.

7. The non-transitory computer-readable storage medium of claim 6, wherein the first indexed dictionary comprises sequences of symbols and transforms for the lexicon.

8. The non-transitory computer-readable storage medium of claim 1, wherein encoding the first segment using the first indexed dictionary and the first transformation set includes generating a codeword for the first segment, the codeword including a length for the first segment, a word entry index value, and a transformation set index value for the first transformation set.

9. A system comprising:
   at least one processor; and
   memory storing instructions that, when executed by the at least one processor, cause the system to:
      determine, for a first segment in a data file, a first context state based on a first context segment within the data file, the first context segment including two bytes that precede the first segment in the data file;
      identify, based on the first context state, a first indexed dictionary from a plurality of indexed dictionaries;
      identify, based on the first context state, a first transformation set from a plurality of transformation sets, wherein the first transformation set includes at least one entry that includes two sets of predefined characters, a first set of the two sets representing a predefined character to insert before an entry in the first indexed dictionary and a second set of the two sets representing a predefined character to append after the entry in the first indexed dictionary; and
      encode the first segment using the first indexed dictionary and the first transformation set.

10. The system of claim 9, the instructions that cause the system to encode the first segment using the first indexed dictionary and the first transformation set, comprise instructions that cause the system to:
   identify a word entry in the first indexed dictionary and a transformation in the first transformation set such that a result of applying the transformation to the word entry matches the first segment.

11. The system of claim 9, wherein the instructions are further configured to cause the system to:
   determine, for a second segment in the data file, a second context state, wherein the second context state is determined based on the two bytes that precede the second segment in the data file;
   identify, based on the second context state, a second indexed dictionary from the plurality of indexed dictionaries, the second indexed dictionary being different than the first indexed dictionary; and
   encode the second segment using the second indexed dictionary.

12. The system of claim 9, wherein the first context state is determined based on a hash of the first context segment.

13. The system of claim 9, wherein the first segment includes a word in a lexicon.

14. The system of claim 9, wherein encoding the first segment using the first indexed dictionary and the first transformation set includes generating a codeword for the first segment, the codeword including a length for the first segment, a word entry index value, and a transformation set index value for the first transformation set.

15. A method comprising:
   determining, for a first segment in a data file, a first context state based on a first context segment within the data file, the first context segment including two bytes that precede the first segment in the data file;
   identifying a first indexed dictionary for the first context state from a plurality of indexed dictionaries;
   identifying a first transformation set for the first context state from a plurality of transformation sets, wherein the first transformation set includes at least one entry that includes two sets of predefined characters, a first set of the two sets representing a predefined character to insert before an entry in the first indexed dictionary and a second set of the two sets representing a predefined character to append after the entry in the first indexed dictionary; and encoding the first segment using the first indexed dictionary and the first transformation set.

16. The method of claim 15, further comprising:

determining, for a second segment in the data file, a second context state, wherein the second context state is determined based on a second context segment within the data file that precedes the second segment;

identifying, based on the second context state, a second indexed dictionary from the plurality of indexed dictionaries, the second indexed dictionary being different than the first indexed dictionary; and encoding the second segment using the second indexed dictionary.

17. The method of claim 15, wherein the at least one entry in the first transformation set further includes predefined characters to append to the entry in the first indexed dictionary.

18. The method of claim 15, wherein the first context state is determined based on a hash of the first context segment.

19. The method of claim 15, wherein encoding the first segment using the first indexed dictionary and the first transformation set includes generating a codeword for the first segment, the codeword including a length for the first segment, a word entry index value, and a transformation set index value for the first transformation set.

* * * * *